United States Patent
Oh et al.

(10) Patent No.: US 8,969,858 B2
(45) Date of Patent: Mar. 3, 2015

(54) ORGANIC LIGHT EMITTING DISPLAY APPARATUS AND METHOD OF MANUFACTURING THE SAME

(71) Applicant: Samsung Display Co., Ltd., Yongin-si, Gyeonggi-do (KR)

(72) Inventors: Eon-Seok Oh, Yongin-si (KR); Bo-Mi Choi, Yongin-si (KR); Hyun-Sung Kang, Yongin-si (KR); Sang-Yeol Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 13/794,714

(22) Filed: Mar. 11, 2013

(65) Prior Publication Data

US 2014/0124744 A1  May 8, 2014

(30) Foreign Application Priority Data

Nov. 8, 2012 (KR) .................. 10-2012-0126159

(51) Int. Cl.
*H01L 27/32* (2006.01)
*H01L 29/08* (2006.01)
*H01L 51/50* (2006.01)

(52) U.S. Cl.
CPC ......... *H01L 27/3218* (2013.01); *H01L 27/3246* (2013.01); *H01L 51/5036* (2013.01); *H01L 27/3211* (2013.01)
USPC ................... 257/40; 257/59; 257/98; 257/99; 438/35; 438/46; 438/22; 438/23

(58) Field of Classification Search
CPC ............ H01L 27/3218; H01L 27/3211; H01L 51/5036; H01L 27/322; H01L 27/3246; H01L 51/56; H01L 51/3056

USPC .......... 257/40, 59, 98, E39.007, E51.001, 99; 438/35, 46, 23, 22

See application file for complete search history.

(56) References Cited

U.S. PATENT DOCUMENTS

| 7,601,439 | B2 | 10/2009 | Chun et al. |
| 7,776,457 | B2 | 8/2010 | Lee et al. |

(Continued)

FOREIGN PATENT DOCUMENTS

| JP | 2002-175878 | 6/2002 |
| JP | 2003-157973 | 5/2003 |

(Continued)

OTHER PUBLICATIONS

Patent Abstracts of Japan, and English machine translation of Japanese Publication 2003-297562 dated Oct. 17, 2003, listed above, (21 pages).

*Primary Examiner* — Thinh T Nguyen
(74) *Attorney, Agent, or Firm* — Christie, Parker & Hale, LLP

(57) ABSTRACT

An organic light emitting display apparatus including a plurality of sub-pixels disposed on a substrate, wherein each of the sub-pixels includes: a first electrode formed on the substrate; an intermediate layer formed on the first electrode and including an organic emission layer; and a second electrode formed on the intermediate layer, wherein at least one sub-pixel for emitting light of a color among the sub-pixels includes a shadow emission layer for emitting light of different color between the organic emission layer and the first electrode, and the organic emission layer of the one sub-pixel includes a hole transport material.

24 Claims, 13 Drawing Sheets

(56) References Cited

U.S. PATENT DOCUMENTS

| | | |
|---|---|---|
| 7,789,724 B2* | 9/2010 | Sung et al. ............... 445/23 |
| 2002/0076847 A1 | 6/2002 | Yamada et al. |
| 2006/0066231 A1 | 3/2006 | Nishikawa et al. |
| 2008/0115729 A1 | 5/2008 | Oda et al. |
| 2011/0052791 A1 | 3/2011 | Jo et al. |
| 2011/0068331 A1 | 3/2011 | Koh et al. |

FOREIGN PATENT DOCUMENTS

| | | |
|---|---|---|
| JP | 2003-297562 | 10/2003 |
| KR | 10-2006-0045225 A | 5/2006 |
| KR | 10-2006-0051746 A | 5/2006 |
| KR | 10-2006-0059323 A | 6/2006 |
| KR | 10-2011-0022512 A | 3/2011 |
| KR | 10-2011-0032589 A | 3/2011 |

* cited by examiner

ORGANIC LIGHT EMITTING DISPLAY APPARATUS AND METHOD OF MANUFACTURING THE SAME

CROSS-REFERENCE TO RELATED PATENT APPLICATION

This application claims priority to and the benefit of Korean Patent Application No. 10-2012-0126159, filed on Nov. 8, 2012, in the Korean Intellectual Property Office, the disclosure of which is incorporated herein in its entirety by reference.

BACKGROUND

1. Field

The following description relates to an organic light emitting display apparatus and a method of manufacturing the same, and more particularly, to an organic light emitting display apparatus capable of improving light emission characteristics and a method of manufacturing the organic light emitting display apparatus.

2. Description of the Related Art

Recently, display apparatuses have been replaced with thin flat panel display apparatuses that are portable. Among flat panel display apparatuses, organic light-emitting display devices have wider viewing angles, better contrast characteristics, and faster response speeds than other display devices, and thus have drawn attention as a next-generation display device.

An organic light-emitting display device includes intermediate layers, a first electrode, a second electrode, and other thin films. The intermediate layer includes an organic emission layer. When a voltage is applied to the first and second electrodes, the organic emission layer generates visible rays.

The intermediate layers and the other thin films included in the organic light emitting display apparatus may be formed in a deposition process. In order to form a set or predetermined pattern on the organic light emitting display apparatus in the deposition process, a deposition mask is generally used.

However, it is difficult to control the deposition processes, and thus, it is not easy to form deposition films of the organic light emitting display apparatus, in particular, the intermediate layers including the organic emission layer relating to the light emission, and consequently, there is a limitation in improving the light emission characteristics of the organic light emission display apparatus.

SUMMARY

An aspect of an embodiment of the present invention is directed toward an organic light emitting display apparatus capable of improving light emission characteristics, and a method of manufacturing the organic light emitting display apparatus.

According to an embodiment of the present invention, there is provided an organic light emitting display apparatus comprising a plurality of sub-pixels disposed on a substrate, wherein each of the sub-pixels includes: a first electrode formed on the substrate; an intermediate layer formed on the first electrode and comprising an organic emission layer; and a second electrode formed on the intermediate layer, wherein at least one sub-pixel emitting light of a color among the sub-pixels includes a shadow emission layer emitting light of different color between the organic emission layer and the first electrode, and the organic emission layer of the one sub-pixel includes a hole transport material.

The sub-pixels may include a red sub-pixel, a green sub-pixel, and a blue sub-pixel.

The one sub-pixel emitting the light of the color may be the red sub-pixel, and the shadow emission layer may contain a material included in at least one of the organic emission layer of the green sub-pixel and the organic emission layer of the blue sub-pixel.

The shadow emission layer may include a plurality of layers emitting light of different colors from each other.

The organic light emitting display apparatus may further include a hole transport layer disposed between the first electrode and the shadow emission layer.

The hole transport layer may have a multi-layered structure.

The organic light emitting display apparatus may further include a thin film transistor (TFT) electrically connected to the first electrode and including an active layer, a gate electrode, a source electrode, and a drain electrode.

The intermediate layer may be formed by using an organic layer deposition apparatus, and a deposition space of the intermediate layer may be formed so that a slanted side of the intermediate layer far from a center of the deposition space is longer than a slanted side of the intermediate layer close to the center of the deposition space.

The intermediate layer may be formed by using an organic layer deposition apparatus, and in the deposition space of the intermediate layer, the further apart from the center of the deposition space, the wider a slanted side of the intermediate layer from the center of the deposition space is.

The intermediate layer may be formed by using an organic layer deposition apparatus, and in the deposition space of the intermediate layer, a region of the intermediate layer disposed at a center of the deposition space may have slanted opposite sides with substantially the same length.

The intermediate layer may be formed by using an organic layer deposition apparatus, and a region disposed at a center of the intermediate layer may be symmetrically disposed based on the center of the deposition space.

The substrate may have a size of 40 inches or greater.

The intermediate layer may be formed by using an organic layer deposition apparatus, and the deposition space of the intermediate layer may have a non-uniform thickness.

According to another embodiment of the present invention, there is provided a method of manufacturing an organic light emitting display apparatus, the method including forming a plurality of sub-pixels on a substrate, wherein the forming of the sub-pixels includes: forming a first electrode on the substrate; forming an intermediate layer including an organic emission layer on the first electrode; and forming a second electrode on the intermediate layer, wherein at least one sub-pixel emitting light of a color among the sub-pixels includes a shadow emission layer emitting light of different color between the organic emission layer and the first electrode, and the organic emission layer of the one sub-pixel comprises a hole transport material.

The shadow emission layer may be formed during forming organic emission layers of the one sub-pixel emitting the light of the color and another sub-pixel emitting the light of the different color, before forming an organic emission layer of the one sub-pixel emitting light of the color among the sub-pixels.

The intermediate layer may be formed by using an organic layer deposition apparatus comprising a plurality of organic layer deposition assemblies, and each of the organic layer deposition assemblies may include a deposition source discharging a deposition material, a deposition source nozzle unit disposed at a side of the deposition source and comprising a plurality of deposition source nozzles, and a patterning slit sheet disposed to face the deposition source nozzle unit and including a plurality of patterning slits, wherein the deposition material discharged from the deposition source may pass through the patterning slit sheet and may be deposited on the substrate to perform a deposition process.

The sub-pixels may include a red sub-pixel, a green sub-pixel, and a blue sub-pixel, and an organic emission layer of the red sub-pixel, an organic emission layer of the green sub-pixel, and an organic emission layer of the blue sub-pixel may be formed respectively by using different organic layer deposition assemblies among the plurality of organic layer deposition assemblies.

The organic layer deposition assembly for forming the organic emission layer of the one sub-pixel, and the organic layer deposition assembly forming the shadow emission layer may be disposed adjacent to each other.

The forming of the intermediate layer by using the organic layer deposition apparatus may include: fixing the substrate on a transfer unit in a loading unit; conveying the transfer unit, on which the substrate is disposed, into a chamber via a first conveyer unit that is configured to pass through the chamber; forming the intermediate layer by moving the substrate relative to the organic layer deposition assembly so that a deposition material discharged from the organic layer deposition assembly is deposited on the substrate, in a state where the organic layer deposition assembly is disposed in the chamber and the organic layer deposition assembly in the chamber and the substrate are spaced a set or predetermined distance apart from each other; separating the substrate, on which the deposition is finished, from the transfer unit in an unloading unit; and conveying the transfer unit separated from the substrate to the loading unit by using a second conveyer unit that is configured to pass through the chamber.

The deposition may be successively performed on the substrate while the substrate passes sequentially through the plurality of organic layer deposition assemblies.

The transfer unit may circulate between the first conveyer unit and the second conveyer unit.

The first conveyer unit and the second conveyer unit may be arranged above and below.

The transfer unit may be conveyed in non-contact to the first conveyer unit in the chamber.

The patterning slit sheet of the organic layer deposition assembly may be formed smaller than the substrate in at least one of a first direction and a second direction perpendicular to the first direction.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, structures and operations of the present invention will be described with reference to accompanying drawings.

Figure 1:
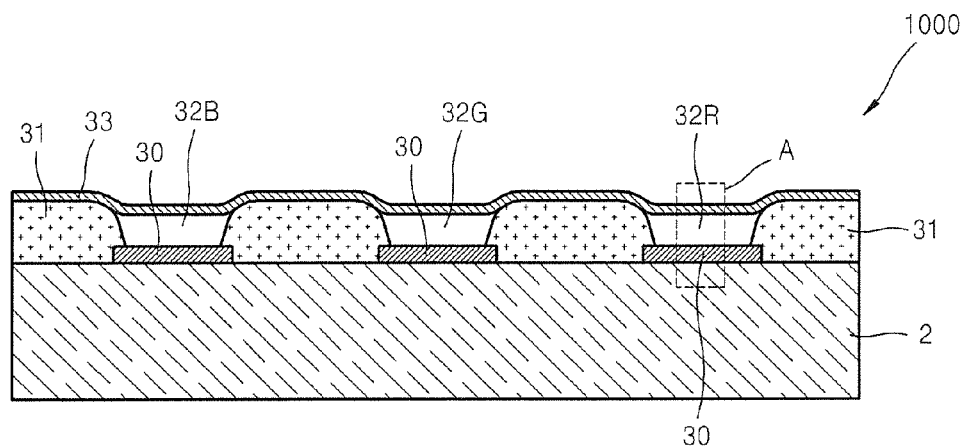
FIG. 1 is a cross-sectional view of an organic light emitting display apparatus according to an embodiment of the present invention.
Figure 2:
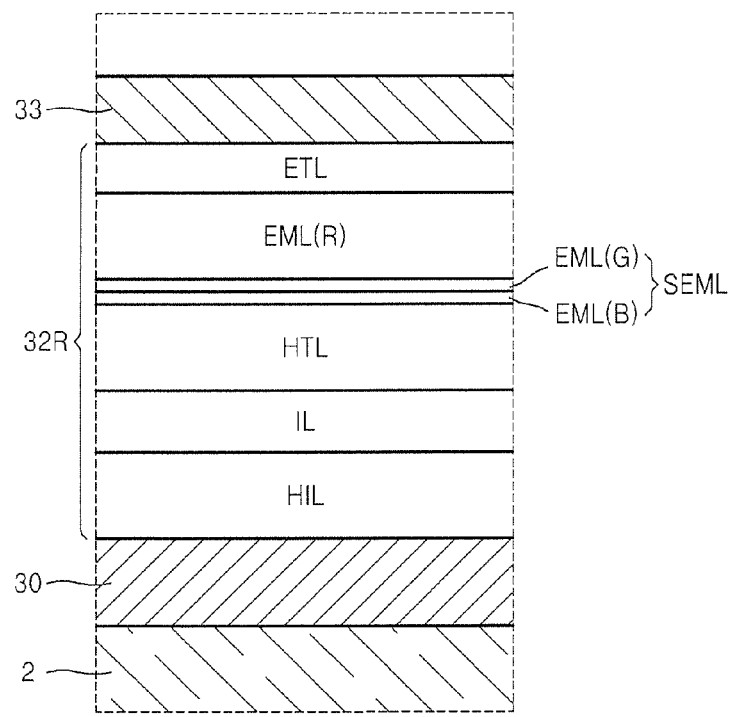
FIG. 2 is an enlarged view of a portion A shown in FIG. 1 according to an embodiment of the present invention.

FIG. 1 is a cross-sectional view of an organic light emitting display apparatus 1000 according to an embodiment of the present invention, and FIG. 2 is an enlarged view of a portion A shown in FIG. 1.

Referring to FIGS. 1 and 2, in the organic light emitting display apparatus 1000, three sub-pixels are formed on a substrate 2.

In addition, each of the sub-pixels includes a first electrode 30, intermediate layers 32R, 32G, and 32B, and a second electrode 33.

That is, a red sub-pixel emitting red visible light includes the first electrode 30, the intermediate layer 32R, and the second electrode 33. A green sub-pixel emitting green visible light includes the first electrode 30, the intermediate layer 32G, and the second electrode 33. In addition, a blue sub-pixel emitting blue visible light includes the first electrode 30, the intermediate layer 32B, and the second electrode 33. The second electrode 33 may be formed commonly throughout all of the sub-pixels.

Each component will be described in more detail below.

The substrate 2 may be formed of a transparent glass material mainly including $SiO_2$. However, the present invention is not limited thereto, that is, the substrate 2 may be formed of a transparent plastic material. Here, the plastic material forming the substrate 2 may be one or more selected from various suitable organic materials.

Although not shown in FIGS. 1 and 2, a buffer layer (not shown) may be further formed between the substrate 2 and the first electrode 30. The buffer layer (not shown) prevents impurity atoms from infiltrating in the substrate 2 and provides a plane surface on the substrate 2, and may be formed of a material capable of performing the above operations. For example, the buffer layer (not shown) may include an inorganic material such as silicon oxide, silicon nitride, silicon oxynitride, aluminum oxide, aluminum nitride, titanium oxide, or titanium nitride, an organic material such as polyimide, polyester, or acryl, or a stacked substance including a plurality of the materials stated above.

The first electrode 30 is formed on the substrate 2. The first electrode 30 may function as an anode and the second electrode 33 may function as a cathode, and vice versa. When the first electrode 30 functions as the anode, the first electrode 30 may include a material having a high work function such as an ITO, IZO, ZnO, or $In_2O_3$. In addition, the first electrode 30 may further include a reflective layer formed of Ag, Mg, Al, Pt, Pd, Au, Ni, Nd, Ir, Cr, Li, Yb, or Ca according to an objective and designing conditions.

Also, the first electrode 30 may be patterned in each of the sub-pixels.

A pixel defining layer 31 is formed of an insulating material on the first electrode 30. Here, the pixel defining layer 31 is formed to expose at least a part of an upper surface of the first electrode 30.

The intermediate layers 32R, 32G, and 32B are formed on the first electrode 30. The intermediate layers 32R, 32G, and 32B include at least an organic emission layer emitting visible rays.

The intermediate layer 32R of the red sub-pixel will be described in more detail with reference to FIG. 2.

The intermediate layer 32R includes an organic emission layer EML(R) emitting red visible light, a shadow emission layer SEML, a hole injection layer (HIL), a hole transport layer (HTL), an insertion layer (IL), and an electron transport layer (ETL).

The HIL may be formed of phthalocyanine compound such as copper phthalocyanine, or TCTA, m-MTDATA, or m-MTDAPB that is star-burst type amine.

The HTL may be formed of N,N'-bis(3-methylphenyl)-N,N'-diphenyl-[1,1-biphenyl]-4, 4'-diamine (TPD), N,N'-di(naphthalene-1-yl)-N,N'-diphenyl benzidine (α-NPD), and the like.

Figure 3:
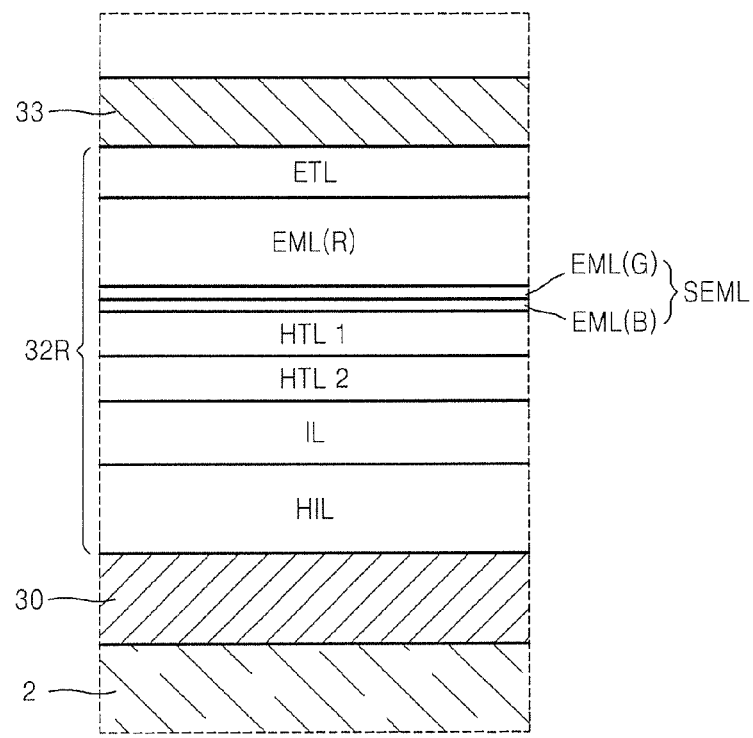
FIG. 3 is an enlarged view of a portion A shown in FIG. 1 according to another embodiment of the present invention.

Also, the HTL may be formed of multiple layers, not a single layer. That is, as shown in FIG. 3, a first HTL (HTL1) and a second HTL (HTL2) may be formed on the HIL.

The IL may be formed between the HTL and the HIL, and the IL may allow the electrons to be generated and transported easily. The IL may be formed of various materials, for example, may include 1,4,5,8,9,12-Hexaazatriphenylenehexanitrile or Tetracyanoquinodimethane (TCNQ).

The ETL may be formed of $Alq_3$. In addition, although not shown in the drawings, an electron injection layer (not shown) may be formed between the ETL and the second electrode 33.

The SEML is formed on the HTL, and the EML(R) is formed on the SEML.

The SEML includes a first emission layer EML(B) and a second emission layer EML(G). The first emission layer EML(B) emits blue visible light, and the second emission layer EML(G) emits green visible light. The SEML is very thin when compared with the EML(R). Also, the SEML may include only one layer, that is, one of the first emission layer EML(B) and the second emission layer EML(G).

The EML(R) may be formed of various materials emitting the red visible light. In addition, the EML(R) may include a host material and a dopant material. Also, the EML(R) may include a hole transport material. Here, the hole transport material may be contained about 5% to 95% of the EML(R) by weight.

The SEML is a layer that desirably should not emit light when the organic emission layer EML(R) emits light. That is, the SEML is undesirably formed of the organic emission layer material of the intermediate layer 32B emitting blue light and the organic emission layer material of the intermediate layer 32G emitting the green light when the organic emission layer EML(R) of the red sub-pixel or before the organic emission layer EML(R) is formed.

That is, when a deposition apparatus is used in a deposition process while moving in a direction or when a deposition target is moved while the deposition apparatus is fixed, the shadow emission layer SEML may be formed. The deposition apparatus and the deposition process using the above deposition apparatus will be described later.

The SEML degrades the light emission characteristics of the organic emission layer EML(R). That is, a main emission region of the organic emission layer EML(R) is on an interface between the organic emission layer EML(R) and the HTL, and in the present embodiment, since the SEML is disposed between the HTL and the EML(R) and the SEML contacts the HTL, an abnormal light emission occurs from the SEML.

However, according to the present embodiment, the organic emission layer EML(R) is formed to contain the hole transport material. As an example, the host material of the organic emission layer EML(R) contains the hole transport material so that the emission region of the red intermediate layer 32R is possibly moved toward the organic emission layer EML(R) from the SEML. As such, characteristics of the red visible light emitted from the intermediate layer 32R of the red sub-pixel can be improved. That is, light emission efficiency of the intermediate layer 32R of the red sub-pixel is improved, and thereby reducing a driving voltage.

Here, the intermediate layer 32G of the green sub-pixel and the intermediate layer 32B of the blue sub-pixel may also be formed similarly to the intermediate layer 32R of the red sub-pixel.

That is, the intermediate layer 32G of the green sub-pixel includes an organic emission layer emitting the red visible light and containing the hole transport material, and may include an SEML emitting the red or blue visible light. Also, the intermediate layer 32B of the blue sub-pixel may include an organic emission layer emitting the blue visible light and containing the hole transport material, and may include an SEML emitting the red or green visible light.

The second electrode 33 is formed on the intermediate layers 32R, 32G, and 32B. When the second electrode 33 functions as a cathode, the second electrode 33 may be formed of metal such as Ag, Mg, Al, Pt, Pd, Au, Ni, Nd, Ir, Cr, Li, or Ca. In addition, the second electrode 33 may include ITO, IZO, ZnO, or $In_2O_3$ so as to transmit light.

In addition, an encapsulation member (not shown) may be formed on the second electrode 33. The encapsulation member (not shown) may be formed of various suitable materials, for example, a substrate of a glass material, or an organic layer and an inorganic layer, and may be formed by alternately stacking the organic layer and the inorganic layer.

In the organic light emitting display apparatus 1000, the intermediate layer including an organic emission layer is formed by using a deposition apparatus. Here, when forming the intermediate layer, an undesired shadow emission layer is formed, besides the organic emission layer emitting the visible light. In the present embodiment, the organic emission layer is formed to contain the hole transport material so that the emission layer of the intermediate layer is possibly moved toward the organic light emission layer from the shadow emission layer in order to improve the light emission efficiency of the intermediate layer. Thus, the organic light emitting display apparatus having an improved light emitting efficiency may be easily formed.

Figure 4:
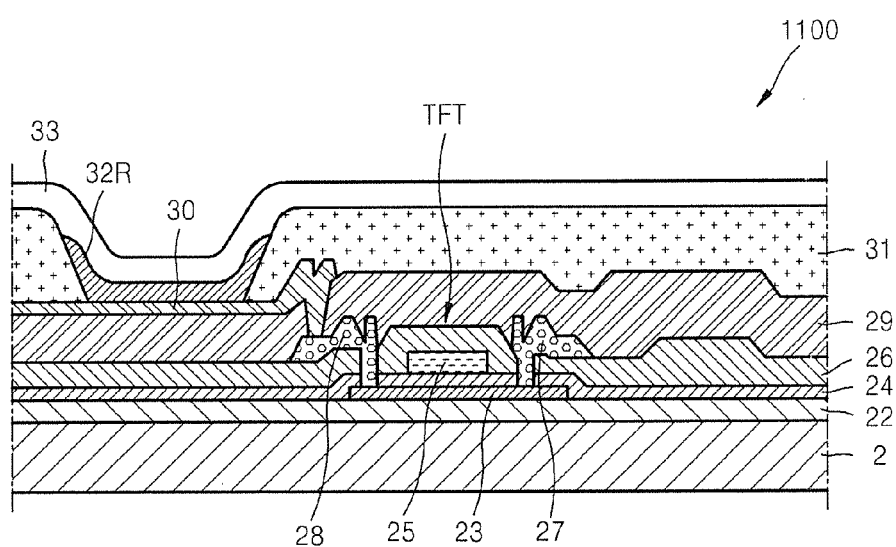
FIG. 4 is a cross-sectional view of an organic light emitting display apparatus according to another embodiment of the present invention.

FIG. 4 is a cross-sectional view schematically showing an organic light emitting display apparatus 1100 according to another embodiment of the present invention.

Referring to FIG. 4, differences of the organic light emitting display apparatus 1100 from those of the previous embodiment will be described below.

In the organic light emitting display apparatus 1100, a plurality of sub-pixels are formed on the substrate 2, and each of the sub-pixels includes the first electrode 30, the intermediate layer 32R, the second electrode 33, and a thin film transistor (TFT). In FIG. 4, a red sub-pixel including the red intermediate layer 32R is only shown for convenience of description. Otherwise, the organic light emitting display apparatus 1100 of the present embodiment may include green and blue sub-pixels as shown in FIG. 1.

A buffer layer 22 is formed on the substrate 2, and an active layer 23 of a predetermined pattern is formed on the buffer layer 22. The active layer 23 may be formed of inorganic semiconductor such as silicon, organic semiconductor, or oxide semiconductor, and includes a source region, a drain region, and a channel region.

A gate insulating layer 24 is formed on the active layer 23, and a gate electrode 25 is formed on a predetermined region on the gate insulating layer 24. The gate insulating layer 24 is formed to insulate the active layer 23 and the gate electrode 25 from each other, and may be formed of an organic material or an inorganic material such as SiNx and $SiO_2$.

The gate electrode 25 may include Au, Ag, Cu, Ni, Pt, Pd, Al, Mo, or an alloy such as Al:Nd and Mo:W; however, the present invention is not limited thereto. That is, the gate electrode 25 may be formed of various materials in consideration of attachability to adjacent layers, flatness, electrical resistance, and processability.

An interlayer dielectric layer 26 is formed on the gate electrode 25. The interlayer dielectric layer 26 and the gate insulating layer 24 are formed to expose the source and drain regions of the active layer 23, and a source electrode 27 and a drain electrode 28 are formed to contact the exposed source and drain regions of the active layer 23.

The source electrode 27 and the drain electrode 28 may be formed of various conductive materials, and may have a single-layered or a multi-layered structure.

A passivation layer 29 is formed on the TFT. In more detail, the passivation layer 29 is formed on the source and drain electrodes 27 and 28.

The passivation layer 29 is formed so as not to cover the entire drain electrode 28, but to expose a predetermined region, and the first electrode 30 is formed to be connected to the exposed region of the drain electrode 28.

The pixel defining layer 31 is formed of an insulating material on the first electrode 30. The pixel defining layer 31 is formed to expose a set or predetermined region of the first electrode 30.

The intermediate layer 32R is formed to contact the exposed portion of the first electrode 30. The intermediate layer 32R includes an organic emission layer, in particular, an organic emission layer emitting red visible light, and since the intermediate layer 32R has the same structure as that of the previous embodiment, detailed descriptions are not provided here.

In addition, the second electrode 33 is connected to the intermediate layer 32R. An encapsulation member (not shown) may be disposed on the second electrode 33.

The organic light emitting display apparatus 1000 shown in FIG. 1, the modified example of FIG. 1 in FIG. 3, and the organic light emitting display apparatus 1100 of FIG. 4 may be manufactured by using various kinds of organic layer deposition apparatus. Such an organic layer deposition apparatus and an organic layer deposition method using the organic layer deposition apparatus will be described below. For the convenience of description, the organic light emitting display apparatus 1000 of FIG. 1 will be described as an example.

Figure 5:
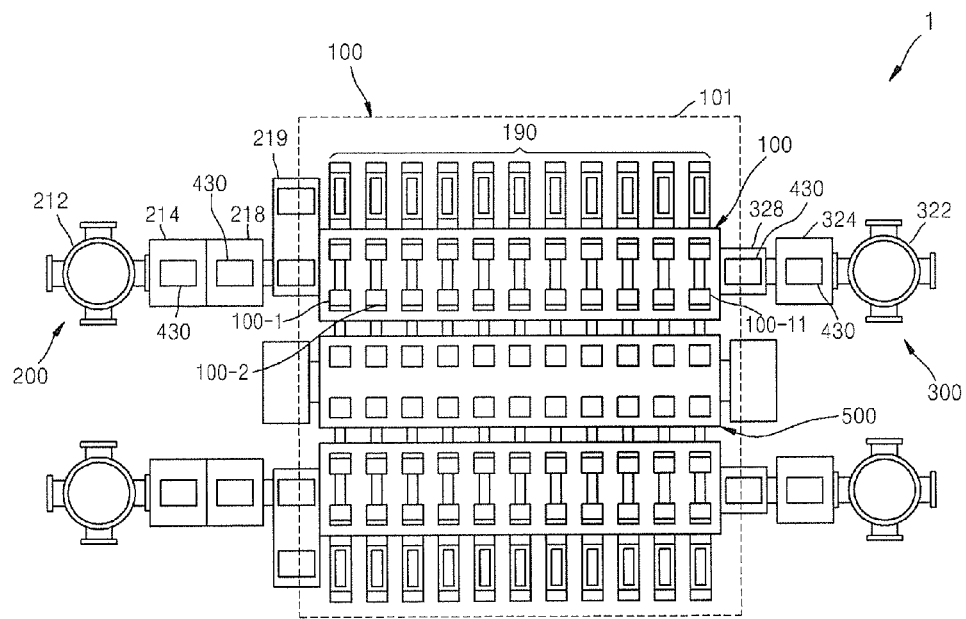
FIG. 5 is a plan view schematically showing a system configuration of an organic layer deposition apparatus for manufacturing the organic light emitting display apparatus of FIG. 1.
Figure 6:
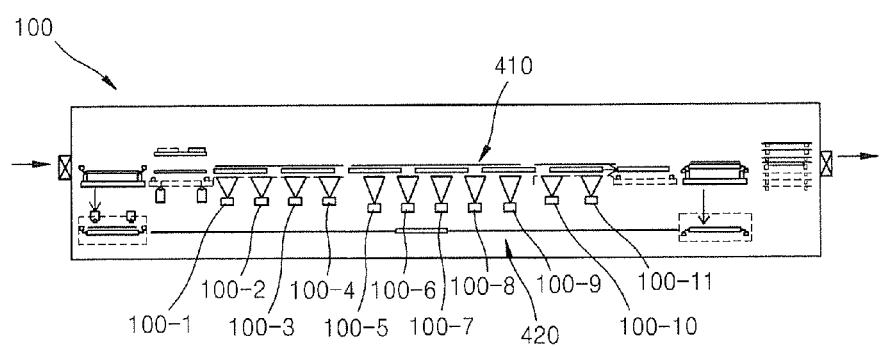
FIG. 6 is a side view schematically showing a deposition unit of the organic layer deposition apparatus of FIG. 5.
Figure 7:
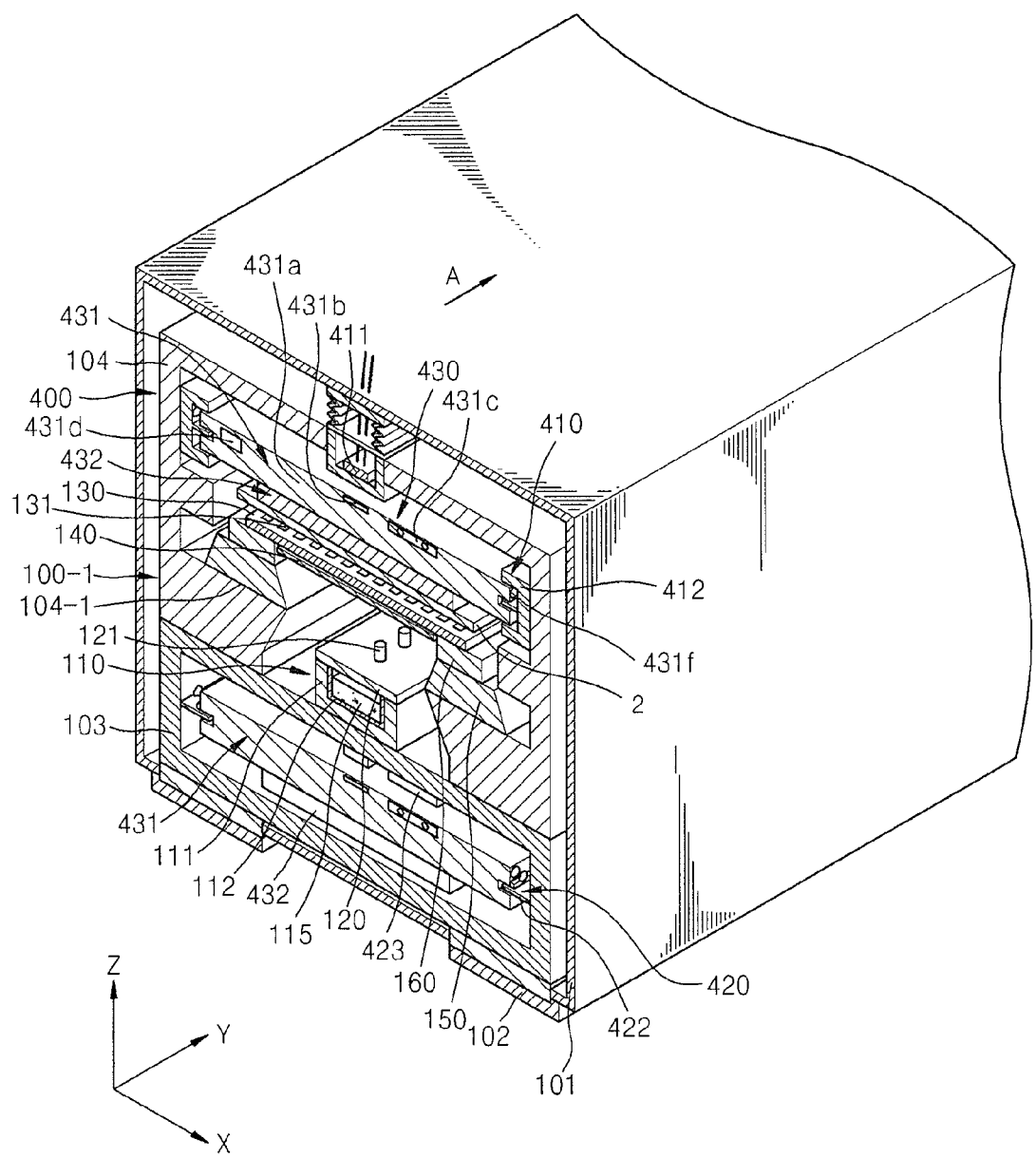
FIG. 7 is a schematic perspective view of the deposition unit shown in FIG. 5.
Figure 8:
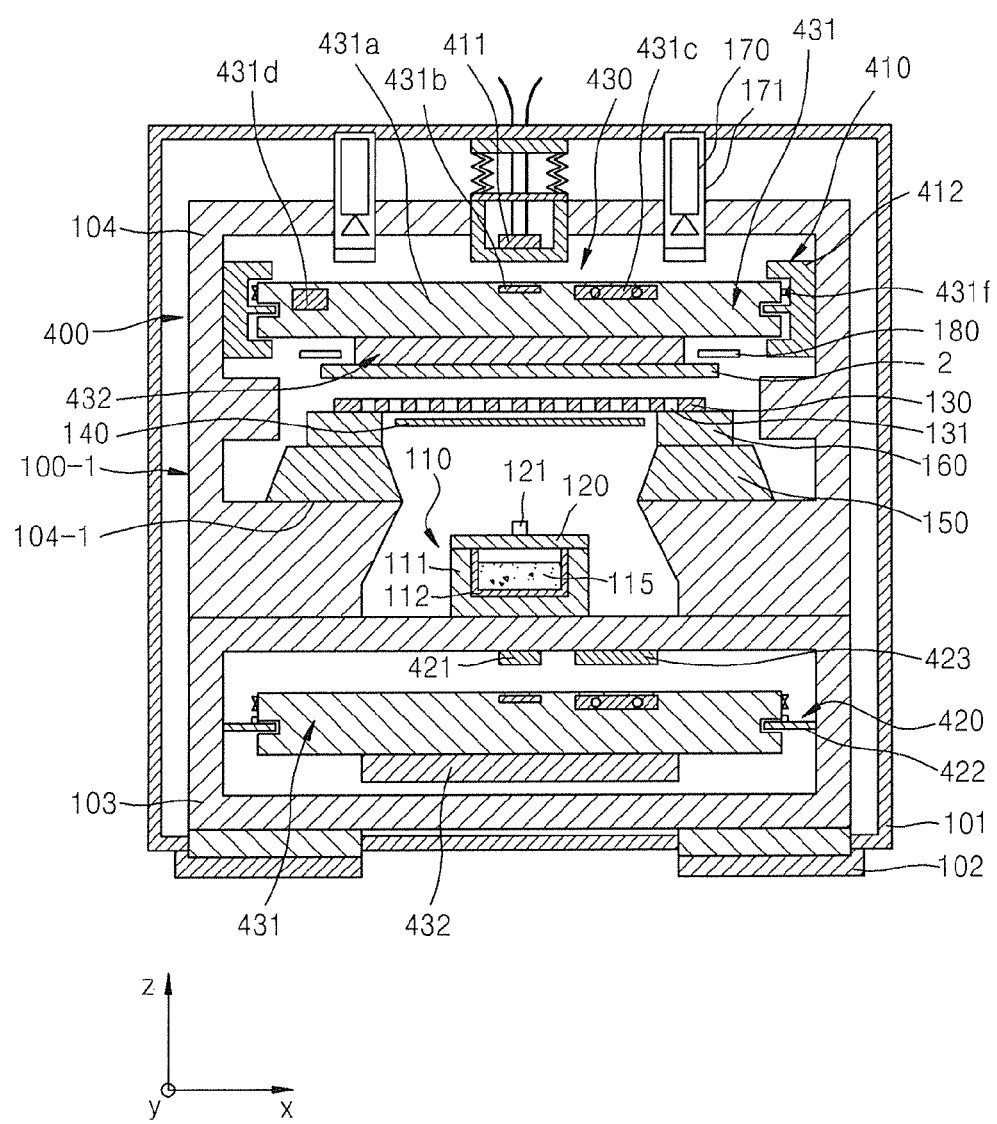
FIG. 8 is a schematic cross-sectional view of the deposition unit of FIG. 7.

FIG. 5 is a plan view of a system configuration schematically showing an organic layer deposition apparatus 1 for manufacturing the organic light emitting display apparatus of FIG. 1, FIG. 6 is a side view of a deposition unit in the organic layer deposition apparatus of FIG. 5, FIG. 7 is a schematic perspective view of the deposition unit of FIG. 5, and FIG. 8 is a schematic cross-sectional view of the deposition unit of FIG. 7.

Referring to FIGS. 5 and 6, the organic layer deposition apparatus 1 of the present embodiment includes a deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material is not applied are stacked up on the first rack 212. A transport robot in the transport chamber 214 picks up one of the substrates 2 from the first rack 212, disposes it on a transfer unit 430 transferred by a second conveyor unit 420, and moves the transfer unit 430 on which the substrate 2 is disposed into the first inversion chamber 218.

The first inversion chamber 218 is disposed adjacent to the transport chamber 214. The first inversion chamber 218 includes a first inversion robot that inverts the transfer unit 430 and then loads it into the first conveyer unit 410 of the deposition unit 100.

Referring to FIG. 5, the transport robot of the transport chamber 214 disposes the substrate 2 on an upper surface of the transfer unit 430, and in this state, the transfer unit 430 is conveyed to the first inversion chamber 218. Then, the first inversion robot of the first inversion chamber 218 inverts the first inversion chamber 218 so that the substrate 2 is turned upside down in the deposition unit 100.

The unloading unit 300 is constituted to operate in an opposite manner to the loading unit 200 described above. Specifically, a second inversion robot in a second inversion chamber 328 inverts the transfer unit 430, which has passed through the deposition unit 100 while the substrate 2 is disposed on the transfer unit 430, and then moves the transfer unit 430 on which the substrate 2 is disposed into an ejection chamber 324. Then, an ejection robot removes the transfer unit 430 on which the substrate 2 is disposed from the ejection chamber 324, separates the substrate 2 from the transfer unit 430, and then loads the substrate 2 into the second rack 322. The transfer unit 430 separated from the substrate 2 is returned back into the loading unit 200 via the second conveyer unit 420.

However, the present invention is not limited to the above description. For example, when disposing the substrate 2 on the transfer unit 430, the substrate 2 may be fixed onto a bottom surface of the transfer unit 430 and then moved into the deposition unit 100. In this case, for example, the first inversion chamber 218 and the first inversion robot, and the second inversion chamber 328 and the second inversion robot are not required.

The deposition unit 100 may include at least one deposition chamber 101. According to the present embodiment, the deposition unit 100 may include a chamber 101, in which a plurality of organic layer deposition assemblies 100-1, 100-2, ..., 100-11 may be disposed.

Although a total of eleven organic layer deposition assemblies, i.e., the first to eleventh organic layer deposition assemblies 100-1, 100-2, ..., 100-11, are installed in the chamber 101, the total number of organic layer deposition assemblies that may be installed in the first chamber 101 may vary according to a deposition material and deposition conditions. The first chamber 101 is maintained in a vacuum state during a deposition process.

Here, some of the eleven organic layer deposition assemblies may be used to form a common layer, and the others may be used for pattern layers. In this case, the organic layer deposition assemblies used to form the common layer may not include an additional patterning slit sheet (see 130 of FIG. 7). As an example of arrangement of the eleven organic layer deposition assemblies, the first organic layer deposition assembly 100-1 may form an HIL that is a common layer, the second organic layer deposition assembly 100-2 may form an IL that is a common layer, the third through fifth organic layer deposition assemblies 100-3 through 100-5 may form an HTL that is a common layer, the sixth organic layer deposition assembly 100-6 may form an organic emission layer that is a pattern layer of a blue intermediate layer 32B, the seventh organic layer deposition assembly 100-7 may form an organic emission layer that is a pattern layer of a green intermediate layer 32G, the eighth organic layer deposition assembly 100-8 may form an organic emission layer EML(R) that is a pattern layer of a red intermediate layer 32R, the ninth organic layer deposition assembly 100-9 may form an ETL that is a common layer IL, and the tenth organic layer deposition assembly 100-10 may form an EIL that is a common layer. The above arrangement of the organic layer deposition assemblies 100-1 through 100-11 may be variously modified.

In the embodiment illustrated in FIG. 5, the transfer unit 430 on which the substrate 2 is disposed may be moved at least to the deposition unit 100 or may be moved sequentially to the loading unit 200, the deposition unit 100, and the unloading unit 300, by the first conveyor unit 410. The transfer unit 430 that is separated from the substrate 2 in the unloading unit 300 is moved back to the loading unit 200 by the second conveyor unit 420.

The first conveyor unit 410 is configured to penetrate through the chamber 101 when passing through the deposition unit 100, and the second conveyor unit 420 is configured to convey the transfer unit 430 that is separated from the substrate 2.

Here, the organic layer deposition apparatus 1 is configured such that the first conveyor unit 410 and the second conveyor unit 420 are respectively disposed above and below so that after the transfer unit 430, on which deposition has been completed while passing through the first conveyor unit 410, is separated from the substrate 2 in the unloading unit 300, the transfer unit 430 is returned to the loading unit 200 via the second conveyor unit 420 formed below the first conveyor unit 410, whereby the organic layer deposition apparatus 1 may have an improved space utilization efficiency.

In an embodiment, the deposition unit 100 of FIG. 5 may further include a deposition source replacement unit 190 disposed at a side of each organic layer deposition assembly 100-1 through 100-11. Although not particularly illustrated in the drawings, the deposition source replacement unit 190 may be formed as a cassette-type that may be drawn to the outside from each organic layer deposition assembly. Thus, a deposition source 110 (refer to FIG. 7) of the organic layer deposition assembly 100-1 may be easily replaced.

FIG. 5 illustrates the organic layer deposition apparatus 1 in which two sets of structures each including the loading unit 200, the deposition unit 100, the unloading unit 300, and the conveyer unit 400 are arranged in parallel. That is, it is understood that two organic layer deposition apparatuses 1 are respectively arranged above and below. In such an embodiment, a patterning slit sheet replacement unit 500 may be disposed between the two organic layer deposition apparatuses 1. That is, due to this configuration of structures, the two organic layer deposition apparatuses 1 share the same patterning slit sheet replacement unit 500, resulting in improved space utilization efficiency, as compared to a case where each organic layer deposition apparatus 1 includes the patterning slit sheet replacement unit 500.

Referring to FIGS. 7 and 8, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the transfer unit 430. In another descriptive manner, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in more detail.

The organic layer deposition assembly 100-1 includes the deposition source 110, a deposition source nozzle unit 120, the patterning slit sheet 130, a shielding member 140, a first stage 150, a second stage 160, a camera 170, and a sensor 180. In this regard, all the elements illustrated in FIGS. 7 and 8 may be arranged in the chamber 101 maintained in an appropriate vacuum state. This structure is needed to achieve the linearity of a deposition material.

In particular, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber (not shown) in the same vacuum state as that used in a deposition method of a fine metal mask (FMM). In addition, the temperature of the patterning slit sheet 130 needs to be sufficiently lower than that of the deposition source 110 (about 100° C. or less) because thermal expansion of the patterning slit sheet 130 by temperatures may be minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate, such as a mother glass, for manufacturing a plurality of flat panel displays, may be used as the substrate 2.

According to an embodiment, the deposition process may be performed with the substrate 2 being moved relative to the organic layer deposition assembly 100-1.

In a conventional deposition method using an FMM, the size of the FMM needs to be the same as that of a substrate. Thus, as the size of the substrate increases, the FMM also needs to be large in size. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 7. Although the substrate 2 is illustrated as being moved in the Y-axis direction in the chamber 101 in FIG. 7 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be much smaller than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is easy to manufacture the patterning slit sheet 130. That is, the small patterning slit sheet 130 is more advantageous in all the manufacturing processes, including etching followed by precise elongation, welding, transferring, and washing processes, than the FMM used in a conventional deposition method. In addition, this is more advantageous for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance. This is described below in more detail.

The deposition source 110 that contains and heats the deposition material 115 is disposed at a side opposite to (facing) a side in which the substrate 2 is disposed in the chamber. As the deposition material 115 contained in the deposition source 110 is vaporized, deposition is performed on the substrate 2.

In more detail, the deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source nozzle unit 120 is disposed at a side of the deposition source 110, and in particular, at the side of the deposition source 110 facing the substrate 2.

Here, according to the organic layer deposition assembly of the present embodiment, deposition nozzles for forming the common layers and the pattern layers may be formed differently from each other. That is, a plurality of deposition source nozzles 121 may be formed in a Y-axis direction, that is, a scanning direction of the substrate 2, in the deposition source nozzle unit for forming the pattern layers. Accordingly, only one deposition source nozzle 121 is formed in an X-axis direction so as to greatly reduce a shadow zone. Although not shown in the drawings, a plurality of deposition source nozzles 121 may be formed in the X-axis direction in the deposition source nozzle unit for forming the common layers. Accordingly, a thickness uniformity of the common layer may be improved.

In one embodiment, the patterning slit sheet 130 may be disposed between the deposition source 110 and the substrate 2. The patterning slit sheet 130 may further include a frame (not shown) having a shape similar to a window frame.

The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

Hereinafter, particular disposition of each element of the upper housing 104 will be described.

The deposition source 110 and the deposition source nozzle unit 120 are disposed on a bottom portion of the upper housing 104. Accommodation portions 104-1 are respectively formed on both sides of the deposition source 100 and the deposition source nozzle unit 120 to have a protruding shape. The first stage 150, the second stage 160, and the patterning slit sheet 130 are sequentially formed on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the second stage 160. The patterning slit sheet 130 is disposed on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be concurrently or simultaneously guided thereby.

The shielding member 140 may be disposed between the patterning slit sheet 130 and the deposition source 110. In particular, an anode or cathode pattern is formed on an edge portion of the substrate 2 and is used as a terminal for inspecting a product or in manufacturing a product. If an organic material is applied on a region of the substrate 2, the anode or the cathode cannot do its part sufficiently. Thus, the edge portion of the substrate 2 is formed to be a non-film-forming region on which an organic material or the like is not applied. As described above, however, in the organic layer deposition apparatus, deposition is performed in a scanning manner while the substrate 2 is moved relative to the organic layer deposition apparatus, and thus, it is not easy to prevent the organic material from being deposited on the non-film-forming region of the substrate 2.

Therefore, to prevent the organic material from being deposited on the non-film-forming region of the substrate 2, in the organic layer deposition apparatus, the shielding member 140 may be disposed on the edge portion of the substrate 2. Although not particularly illustrated in FIGS. 3 and 4, the shielding member 140 may include two adjacent plates.

When the substrate 2 does not pass through the organic layer deposition assembly 100-1, the shielding member 140 screens the deposition source 110, and thus, the deposition material 115 discharged from the deposition source 110 does not reach the patterning slit sheet 130. When the substrate 2 enters into the organic layer deposition assembly 100-1 with the shielding member 140 screening the deposition source 110, a front part of the shielding member 140 which screens the deposition source 110 moves along with the movement of the substrate 2, and thus, the flow path of the deposition material 115 is opened and the deposition material 115 discharged from the deposition source 110 passes through the patterning slit sheet 130 and is deposited on the substrate 2. On the other hand, while the substrate 2 is passing through the organic layer deposition assembly 100-1, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

As described above, the non-film-forming region of the substrate 2 is screened by the shielding member 140, and thus, it may be easy to prevent the organic material from being deposited on the non-film-forming region of the substrate 2 without using a separate structure.

Hereinafter, the conveyer unit 400 that conveys the substrate 2, on which the deposition material 115 is to be deposited, is described in more detail.

The conveyer unit 400 includes the first conveyer unit 410, the second conveyer unit 420, and the transfer unit 430.

The first conveyer unit 410 conveys in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1. The first conveyer unit 410 includes a coil 411, guide members 412, upper magnetically suspended bearings 413, side magnetically suspended bearings 414, and gap sensors 415 and 416.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed along the first conveyer unit 410 and the second conveyer unit 420 and the electrostatic chuck 432 that is combined on a surface of the carrier 431 and to which the substrate 2 is attached.

Hereinafter, each element of the conveyer unit 400 will be described in more detail.

The carrier 431 of the transfer unit 430 will now be described in more detail.

The carrier 431 includes a main body part 431a, a magnetic rail 431b, contactless power supply (CPS) modules 431c, a power supply unit 431d, and guide grooves 431e. The carrier 431 may further include cam followers 431f.

The main body part 431a constitutes a base part of the carrier 431 and may be formed of a magnetic material such as iron. In this regard, due to a repulsive force between the main body part 431a and the respective upper and side magnetically suspended bearings 413 and 414, which are described below, the carrier 431 may be maintained spaced apart from the guide members 412 by a certain distance.

The magnetic rail 431b may be formed along a center line of the main body part 431a in a direction where the main body part 431a proceeds. The magnetic rail 431b and the coil 411 may be combined with each other to constitute a linear motor, and the carrier 431 may be conveyed in an arrow A direction by the linear motor.

The CPS modules 431c and the power supply unit 431d may be respectively formed on both sides of the magnetic rail 431b in the main body part 431a. The power supply unit 431d includes a battery (e.g., a rechargeable battery) that provides power so that the electrostatic chuck 432 can chuck the substrate 2 and maintains operation. The CPS modules 431c are a wireless charging module that charges the power supply unit 431d. In particular, the charging track 423 formed in the second conveyer unit 420, which are described below, is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, the first conveyer unit 410 and the transfer unit 430 are described in more detail.

The first conveyer unit 410 conveys the electrostatic chuck 432 that fixes the substrate 2 and conveys the carrier 431 that conveys the electrostatic chuck 432. In this regard, the first conveyer unit 410 includes the coil 411, the guide members 412, upper magnetically suspended bearings (not shown), side magnetically suspended bearings (not shown), and gap sensors (not shown).

The coil 411 and the guide members 412 are formed inside the upper housing 104. The coil 411 is formed in an upper portion of the upper housing 104, and the guide members 421 are respectively formed on both inner sides of the upper housing 104.

The guide members 412 guide the carrier 431 to move in a direction. In this regard, the guide members 412 are formed to pass through the deposition unit 100.

In particular, the guide members 412 accommodate both sides of the carrier 431 to guide the carrier 431 to move along in the direction of arrow A illustrated in FIG. 7.

The side magnetically suspended bearings (not shown) are each disposed in side surfaces of the guide member 412 so as to respectively correspond to both sides of the carrier 431. The side magnetically suspended bearings cause a distance between the carrier 431 and the guide member 412 so that the carrier 431 is moved along the guide members 412 in non-contact with the guide members 412.

The upper magnetically suspended bearing (not shown) may be disposed in side surfaces of the guide members 412 so as to be above the carrier 431. The upper magnetically suspended bearings enable the carrier 431 to be moved along the guide members 412 in non-contact with the guide members 412.

The guide members 412 may further include the gap sensors (not shown) so as to measure a distance between the carrier 431 and the guide member 412.

Hereinafter, an operation of the transfer unit 430 is described in more detail.

The magnetic rail 431*b* of the main body part 431*a* and the coil 411 may be combined with each other to constitute an operation unit. In this regard, the operation unit may be a linear motor. The linear motor has a small frictional coefficient, little position error, and a very high degree of position determination, as compared to a conventional slide guide system. As described above, the linear motor may include the coil 411 and the magnetic rail 431*b*. The magnetic rail 431*b* is linearly disposed on the carrier 431, and a plurality of the coils 411 may be disposed at an inner side of the chamber 101 by a certain distance so as to face the magnetic rail 431*b*. Since the magnetic rail 431*b* is disposed on the carrier 431 instead of the coil 411, the carrier 431 may be operable without power being supplied thereto.

In this regard, the coil 411 may be formed in an atmosphere (ATM) box. In particular, even though the linear motor generally has a very high degree of position determination as compared to a conventional slide guide system, it is difficult to use the linear motor in a vacuum environment due to the outgassing of the coil. In a conveying system employed in the organic layer deposition apparatus according to the present embodiment, however, the magnetic rail 431*b* and the coil 411 may be operated by being spaced apart from each other by a distance of approximately 5 mm, and thus, the coil 411 is included in the ATM box in an air atmosphere and the carrier 431 to which the magnetic rail 431*b* is attached may be moved in the chamber 101 maintained in vacuum. This will now be described in more detail.

Hereinafter, the second conveyer unit 420 and the transfer unit 430 are described in detail.

The second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

In particular, the coil 421, the roller guides 422, and the charging track 423 may be positioned inside the lower housing 103. The coil 421 and the charging track 423 may be disposed on a top inner surface of the lower housing 103, and the roller guides 422 may be disposed on both inner sides of the lower housing 103. Although not illustrated in the drawings, the coil 421 may be disposed in an ATM box, as the coil 411 of the first conveyer unit 410.

Like the first conveyer unit 410, the second conveyer unit 410 may also include the coil 421. Also, the magnetic rail 431*b* of the main body part 431*a* of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 7.

The roller guides 422 guide the carrier 431 to move in a direction. In this regard, the roller guides 422 are formed to pass through the deposition unit 100. In particular, the roller guides 422 support cam followers 431*f* respectively formed on both sides of the carrier 431 to guide the carrier 431 to move along a direction opposite to the direction of arrow A illustrated in FIG. 7. That is, the carrier 431 is moved with the cam followers 431*f* disposed on both sides of the carrier 431 respectively rotating along the roller guides 422. In this regard, the cam followers 431*f* are utilized as bearings used to accurately repeat a particular operation. In an embodiment, a plurality of the cam followers 431*f* are formed on a side surface of the carrier 431 and serve as a wheel for conveying the carrier 431 in the second conveyer unit 420. A detailed description of the cam followers 431*f* is not provided herein.

Therefore, the second conveyer unit 420 is used in a process of returning the carrier 431 from which the substrate 2 has been separated and not in a process of depositing an organic material on the substrate 2, and thus, position accuracy thereof is not needed as by the first conveyer unit 410. Therefore, magnetic suspension is applied to the first conveyer unit 410 that requires high position accuracy, thereby obtaining position accuracy, and a conventional roller method is applied to the second conveyer unit 420 that requires relatively low position accuracy, thereby reducing manufacturing costs and simplifying a structure of the organic layer deposition apparatus. Although not illustrated in FIG. 8, the magnetic suspension may also be applied to the second conveyer unit 420 as in the first conveyer unit 410.

The organic layer deposition assembly 100-1 of the organic layer deposition apparatus 1 according to the present embodiment may further include the camera 170 and the sensor 180 for an aligning process.

In more detail, the camera 170 may align in real time a first alignment mark (not shown) formed in the frame 135 of the patterning slit sheet 130 and a second alignment mark (not shown) formed on the substrate 2. In this regard, the camera 170 is disposed to more accurately view in the chamber 101 maintained in vacuum during deposition. For this, the camera 170 may be installed in a camera accommodation unit 171 in an atmospheric state. That is, a hall is formed in the chamber 101 to correspond to the camera 170, and thus, the camera 170 is opened to the outside, and the camera accommodation unit 171 is formed to extend from the hall. Thus, the camera 170 may be installed in the camera accommodation unit 171 in an atmospheric state, and the inside of the chamber 101 may still be maintained in a vacuum state. Due to such a structure, even though the chamber 101 is repeatedly contracted and expanded, the camera accommodation unit 171 and the camera 170 accommodated therein may be maintained in a fixed position. Therefore, the camera 170 may view more accurately in the chamber 101 maintained in vacuum during deposition.

Since the substrate 2 and the patterning slit sheet 130 are spaced apart from each other by a certain distance, distances to the substrate 2 and the patterning slit sheet 130 that are disposed at different positions need to be both measured using the camera 170. For this operation, the organic layer deposition assembly 100-1 of the organic layer deposition apparatus 1 may include the sensor 180. In this regard, the sensor 180 may be a confocal sensor. The confocal sensor may scan an object to be measured by using laser beams that rotate at high speed by using a scanning mirror and measure a distance to the object by using fluorescent or reflected rays emitted by the laser beams. The confocal sensor may measure a distance by sensing a boundary interface between different media.

That is, the sensor 180, such as a confocal sensor, is disposed in the chamber 101 and positioned on the substrate 2. The confocal sensor may measure a distance to a top surface of the substrate 2 by sensing a boundary interface between the top surface of the substrate 2 and a space and measure a distance to a bottom surface of the substrate 2 by sensing a boundary interface between the bottom surface of the substrate 2 and a space. In addition, the sensor 180 may measure a distance to a top surface of the patterning slit sheet 130 by sensing a boundary interface between a space and the patterning slit sheet 130. Consequently, the sensor 180 may obtain a distance between the substrate 2 and the patterning slit sheet 130 by measuring a distance to the bottom surface of the substrate 2 and a distance to the top surface of the patterning slit sheet 130.

Since a distance between the substrate 2 and the patterning slit sheet 130 is measurable in real time using the camera 170 and the sensor 180, the substrate 2 may be aligned with the patterning slit sheet 130 in real time, whereby position accuracy of a pattern may be significantly improved.

Figure 9:
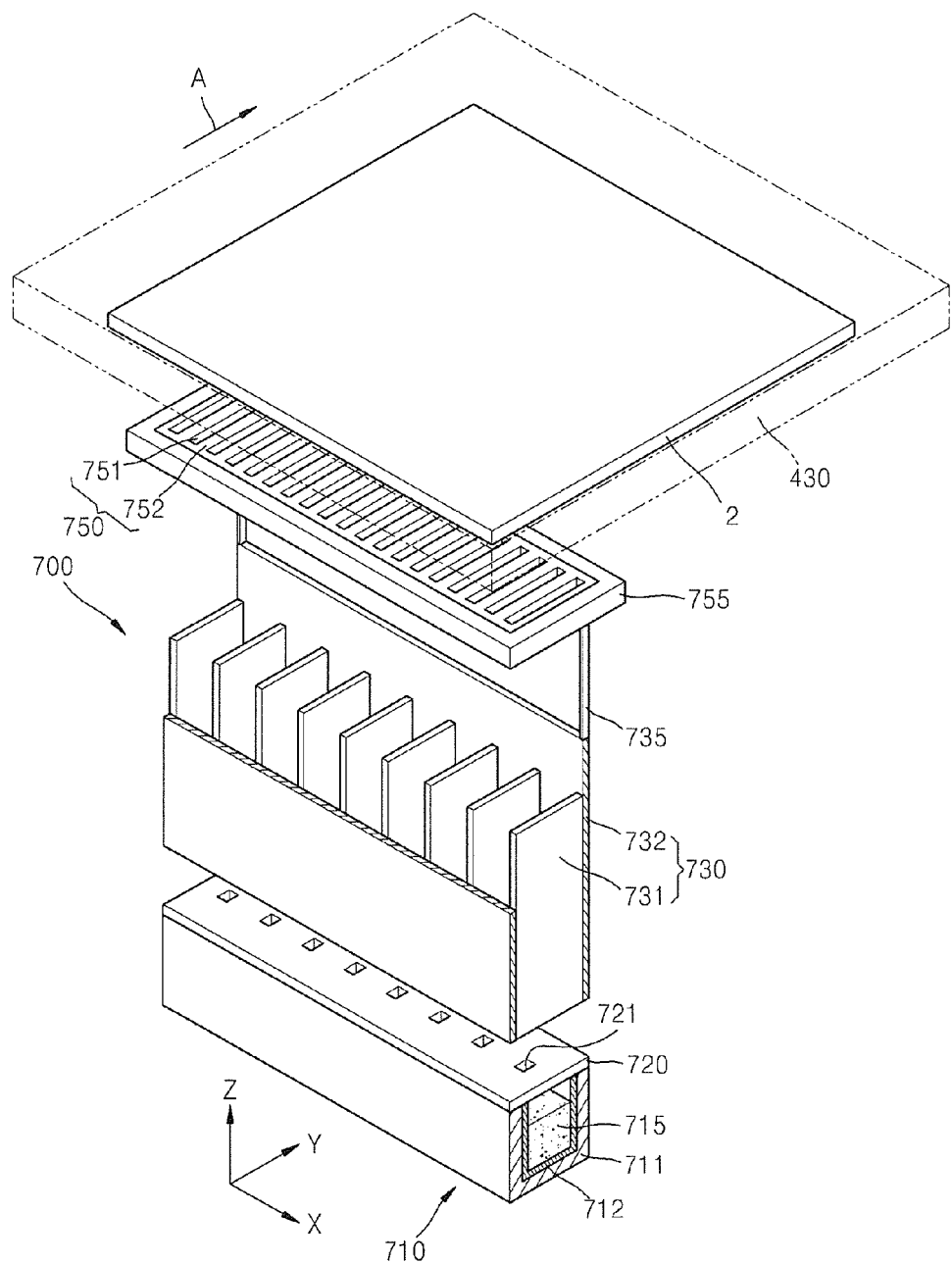
FIG. 9 is a schematic perspective view showing an organic layer deposition assembly for manufacturing the organic light emitting display apparatus of FIG. 1.
Figure 10:
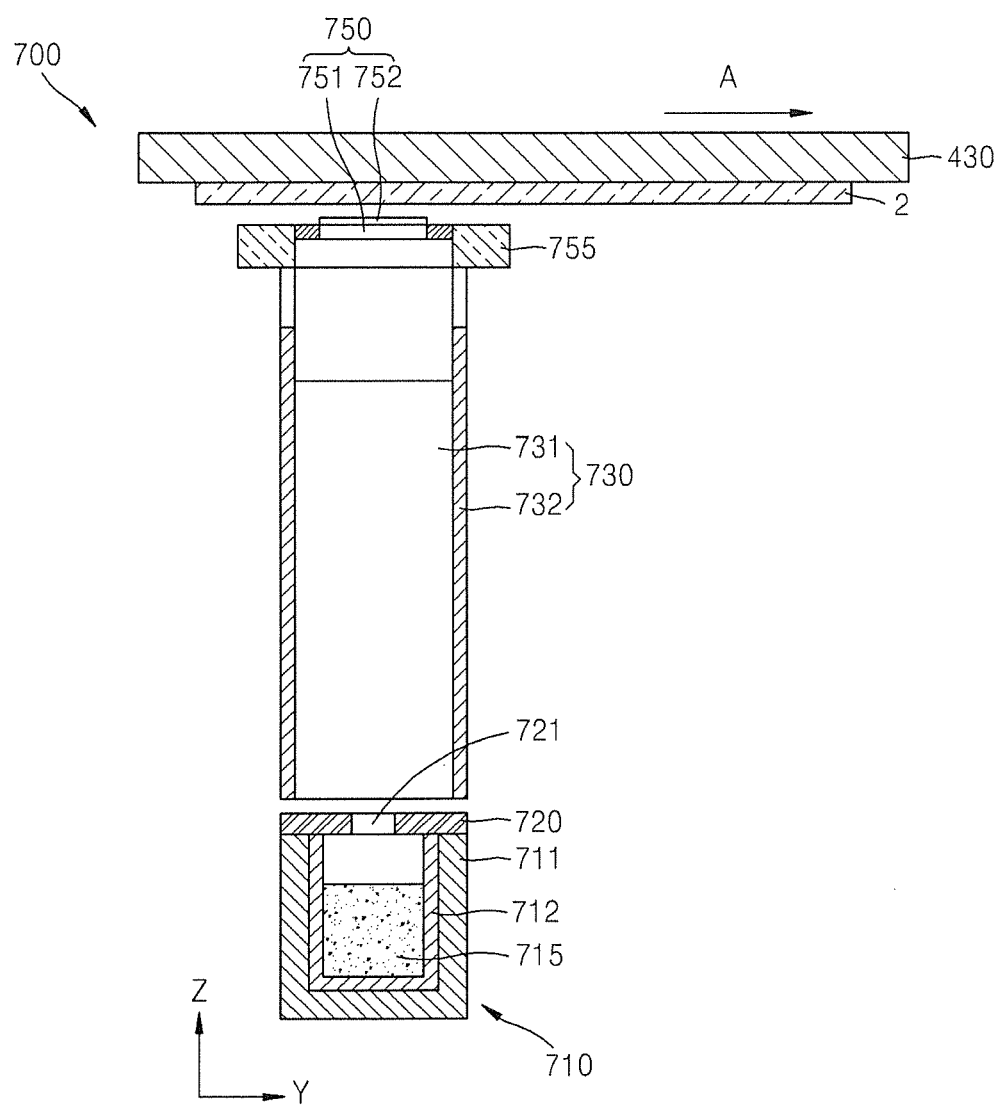
FIG. 10 is a schematic side sectional view of the organic layer deposition assembly of FIG. 9.
Figure 11:
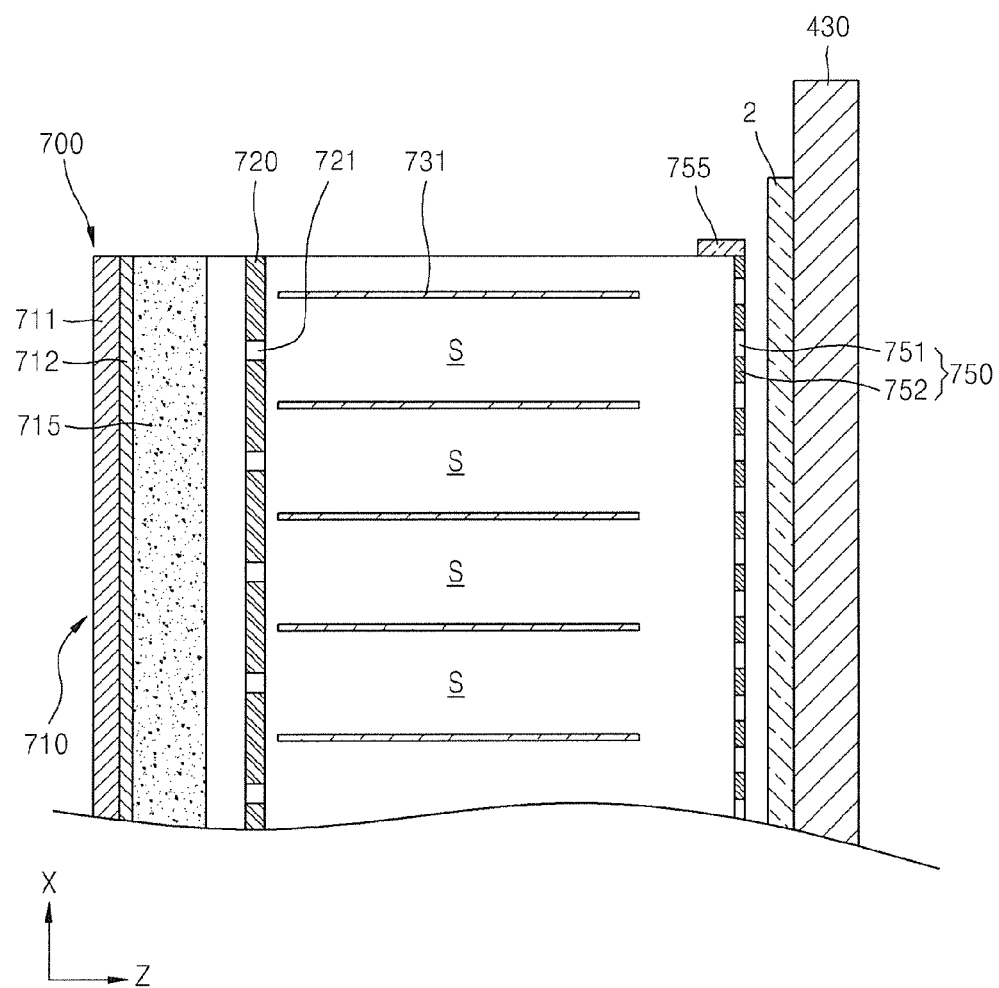
FIG. 11 is a schematic plane-sectional view of the organic layer deposition assembly of FIG. 9.

FIG. 9 is a schematic perspective view of an organic layer deposition assembly 700 for manufacturing the organic light emitting display apparatus of FIG. 1, FIG. 10 is a schematic side-sectional view of the organic layer deposition apparatus 700 of FIG. 9, and FIG. 11 is a schematic plane-sectional view of the organic layer deposition apparatus 700 of FIG. 9.

For the convenience of description, differences from the previous embodiment will be described below.

Referring to FIGS. 9 through 11, the organic layer deposition assembly 700 according to the present embodiment includes a deposition source 710, a deposition source nozzle unit 720, a barrier plate assembly 730, and a patterning slit sheet 750.

The organic layer deposition assembly 700 of the present embodiment may be applied to the organic layer deposition apparatus 1 described above.

The patterning slit sheet 750 may be disposed between the deposition source 710 and the substrate 2. The patterning slit sheet 750 may further include a frame (not shown) having a shape similar to a window frame. The patterning slit sheet 750 includes a plurality of patterning slits 751 arranged in the X-axis direction. An intermediate region 752 is formed between two adjacent patterning slits 751.

Since the patterning slit sheet 750 has the same structure as that of the patterning slit sheet 130, detailed descriptions thereof are not provided here.

The deposition material 715 that has been vaporized in the deposition source 710 passes through the deposition source nozzle unit 720 and the patterning slit sheet 750 and is then deposited onto the substrate 2.

The deposition source 710 includes a crucible 711 that is filled with the deposition material 715 and a heater 712 that heats the crucible 711 so as to vaporize the deposition material 715 toward a side of the crucible 711 filled with the deposition material 715, in particular, toward the deposition source nozzle unit 720. In addition, the deposition source nozzle unit 720 is disposed at a side of the deposition source 710, and the deposition source nozzle unit 720 includes a plurality of deposition nozzles 721 arranged in the X-axis direction.

The barrier plate assembly 730 is disposed at a side of the deposition source nozzle unit 720. The barrier plate assembly 730 includes a plurality of barrier plates 731, and a barrier plate frame 732 that covers sides of the barrier plates 731. The plurality of barrier plates 731 may be arranged parallel to each other at equal intervals in the X-axis direction. In addition, each of the barrier plates 731 may be arranged parallel to a Y-Z plane in FIG. 9, and may have a rectangular shape. The plurality of barrier plates 731 arranged as described above partition the space between the deposition source nozzle unit 720 and the patterning slit sheet 750 into a plurality of sub-deposition spaces S. In the thin film deposition assembly 700 according to the present embodiment, as illustrated in FIG. 10, a deposition space is divided by the barrier plates 731 into sub-deposition spaces S that respectively correspond to the deposition source nozzles 721 through which the deposition material 715 is discharged. As described above, since the barrier plates 731 partition the space between the deposition source nozzle unit 720 and the patterning slit sheet 750 into the sub-deposition spaces S, the deposition material discharged through each of the deposition source nozzles 721 is not mixed with the deposition material discharged through the other deposition source nozzles 721, and passes through the patterning slits 751 so as to be deposited on the substrate 2. In other words, the barrier plates 731 guide the deposition material, which is discharged through the deposition source nozzles slits 721, to move straight to not flow in the X-axis direction.

As described above, by ensuring the linearity of the deposition material via the barrier plates 731, a smaller shadow zone may be formed on the substrate 2, and thus, the thin film deposition assembly 700 and the substrate 2 can be separated from each other by a set or predetermined distance.

Also, the substrate 2 is moved relative to the organic layer deposition assembly 700 in a state of being fixed by the electrostatic chuck of the transfer unit 430, and thus, the deposition process may be performed.

In addition, although not shown in the drawings, the present invention may include an organic layer deposition apparatus including a plurality of the organic layer deposition assemblies 700 according to the present embodiment so that the deposition is performed while the substrate 2 may pass through each of the organic layer deposition assemblies 700 sequentially.

Figure 12:
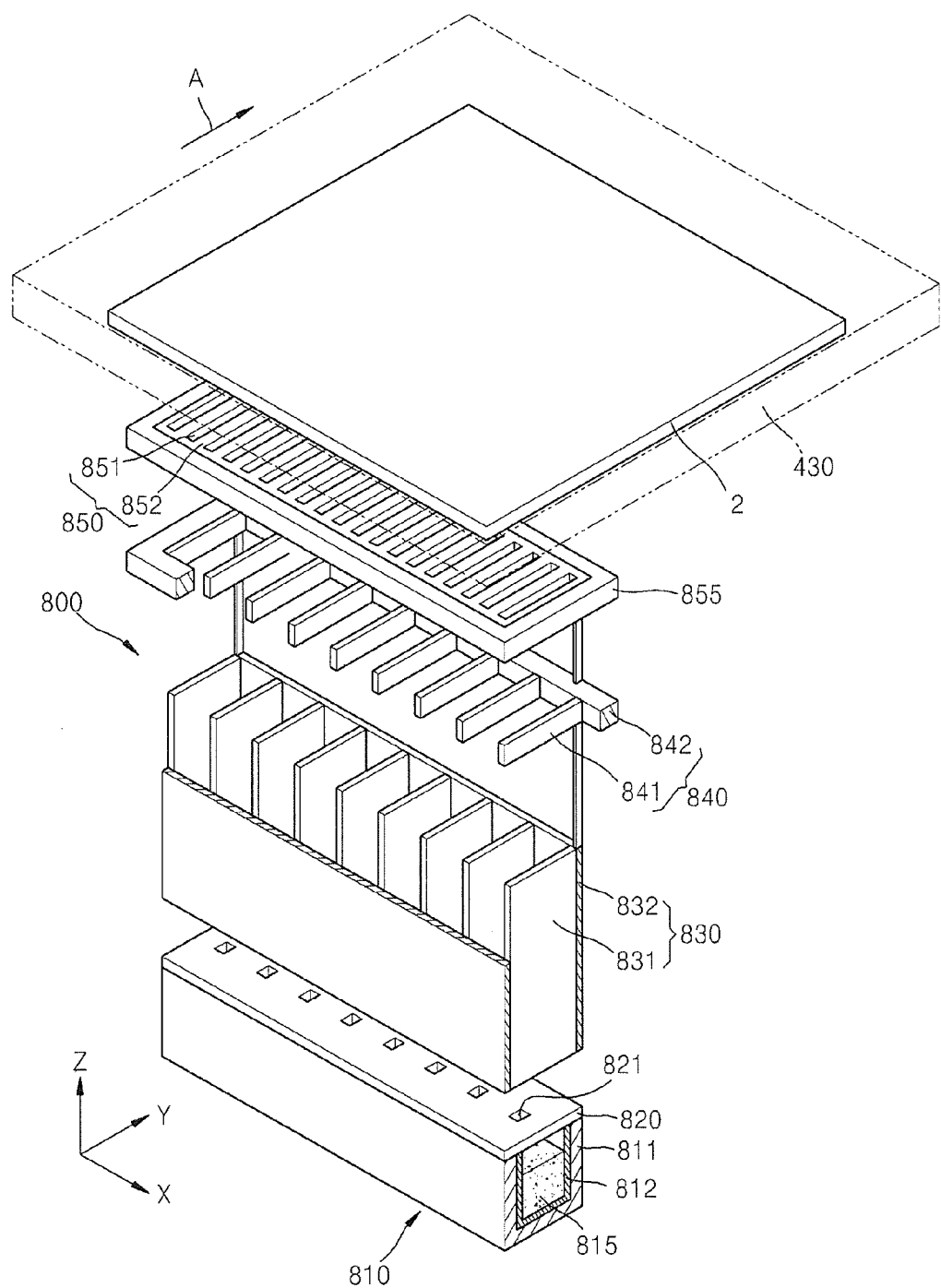
FIG. 12 is a schematic perspective view showing another example of the organic layer deposition assembly for manufacturing the organic light emission display apparatus of FIG. 1.

FIG. 12 is a schematic perspective view of an organic layer deposition assembly 800 for manufacturing the organic light emitting display apparatus of FIG. 1, according to another embodiment of the present invention. For the convenience of description, differences from that of the previous embodiment will be described below.

Referring to FIG. 12, the organic layer deposition assembly 800 may include a deposition source 810, a deposition source nozzle unit 820, a first barrier plate assembly 830, a second barrier plate assembly 840, and a patterning slit sheet 850.

The patterning slit sheet 850 may be disposed between the deposition source 810 and the substrate 2. The patterning slit sheet 850 may further include a frame (not shown) having a shape similar to a window frame. The patterning slit sheet 850 includes a plurality of patterning slits 851 arranged in the X-axis direction. An intermediate region 852 is formed between two adjacent patterning slits 851.

Since the patterning slit sheet 850 has the same structure as that of the patterning slit sheet 130, detailed descriptions thereof are not provided here.

Also, the deposition source 810 and the first barrier plate assembly 830 are the same as those of the embodiment described with reference to FIG. 7, and detailed descriptions thereof are not provided. The present embodiment is different from the previous embodiment in that the second barrier plate assembly 840 is disposed at a side of the first barrier plate assembly 830.

In more detail, the second barrier plate assembly 840 includes a plurality of second barrier plates 841, and a second barrier plate frame 842 that covers sides of the second barrier plates 841. The plurality of second barrier plates 841 may be arranged parallel to each other at equal intervals in the X-axis direction. In addition, each of the second barrier plates 841 may be formed to extend in the YZ plane in FIG. 12, i.e., perpendicular to the X-axis direction.

The plurality of first barrier plates 831 and second barrier plates 841 arranged as described above partition the space between the deposition source nozzle unit 820 and the patterning slit sheet 850. The deposition space is divided by the first barrier plates 831 and the second barrier plates 841 into sub-deposition spaces that respectively correspond to the deposition source nozzles 821 through which the deposition material is discharged.

The second barrier plates 841 may be disposed to correspond respectively to the first barrier plates 831. The second barrier plates 841 may be respectively aligned with the first barrier plates 831 to be parallel thereto on the same plane as the first barrier plates 831. Each pair of the corresponding first and second barrier plates 831 and 841 may be located on the same plane. Although the first barrier plates 831 and the second barrier plates 841 are respectively illustrated as having the same thickness in the X-axis direction, aspects of the present invention are not limited thereto. In other words, the second barrier plates 841, which need to be accurately aligned with the patterning slits 851, may be formed to be relatively thin, whereas the first barrier plates 831, which do not need to be precisely aligned with the patterning slits 151, may be formed to be relatively thick. This makes it easier to manufacture the organic layer deposition assembly.

Also, the substrate 2 is moved relative to the organic layer deposition assembly 800 in a state of being fixed by the electrostatic chuck of the transfer unit 430, and thus, the deposition process may be performed.

In addition, although not shown in FIG. 12, the present invention may include an organic layer deposition apparatus including a plurality of the organic layer deposition assemblies 800 according to the present embodiment so that the deposition is performed while the substrate 2 may pass through each of the organic layer deposition assemblies 800 sequentially.

Figure 13:
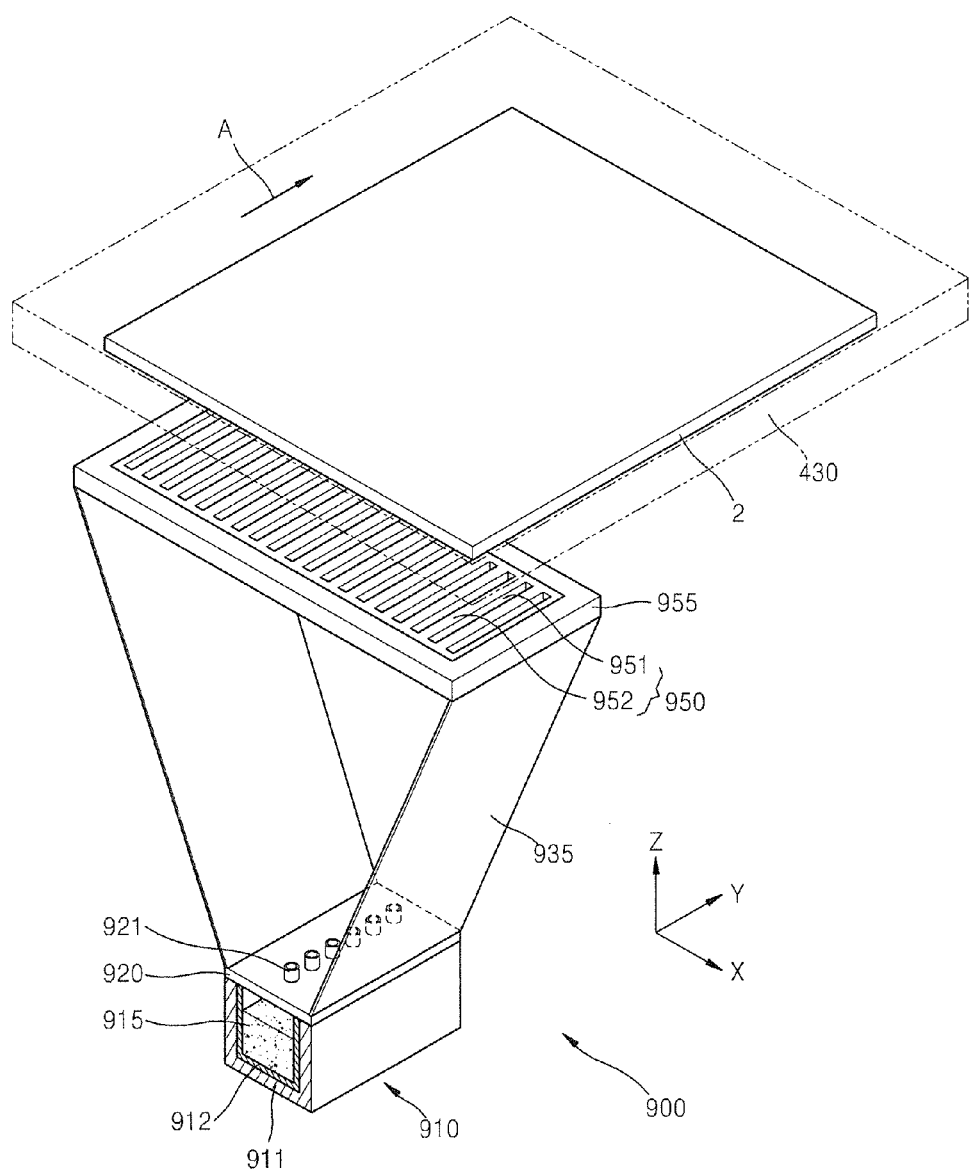
FIG. 13 is a schematic perspective view showing another example of the organic layer deposition assembly for manufacturing the organic light emission display apparatus of FIG. 1.

FIG. 13 is a schematic perspective view of an organic layer deposition assembly 900 according to another embodiment of the present invention. For the convenience of description, differences from those of previous embodiments will be described below.

Referring to FIG. 13, the organic layer deposition assembly 900 according to the current embodiment includes a deposition source 910, a deposition source nozzle unit 920, and a patterning slit sheet 950.

The patterning slit sheet 950 may be disposed between the deposition source 910 and the substrate 2. The patterning slit sheet 950 may further include a frame (not shown) having a shape similar to a window frame. The patterning slit sheet 950 includes a plurality of patterning slits 951 arranged in the X-axis direction. An intermediate region 952 is formed between two adjacent patterning slits 951.

Since the patterning slit sheet 950 has the same structure as that of the patterning slit sheet 130, detailed descriptions thereof are not provided here.

Here, the deposition source 910 includes a crucible 911 that is filled with a deposition material 915, and a heater 912 that heats the crucible 911 to vaporize the deposition material 915, which is contained in the crucible 911, so as to move the vaporized deposition material 915 to the deposition source nozzle unit 920. The deposition source nozzle unit 920 is disposed at a side of the deposition source 910. The deposition source nozzle unit 920 includes a plurality of deposition source nozzles 921 arranged in the Y-axis direction.

In addition, the deposition source 910 and the deposition source nozzle unit 920 may be connected to the patterning slit sheet 950 by a connection member 935.

The deposition source nozzle unit 920 includes the plurality of deposition source nozzles 921 arranged at equal intervals in the Y-axis direction, i.e., a scanning direction of the substrate 2. The deposition material 915 that is vaporized in the deposition source 910, passes through the deposition source nozzle unit 920 towards the substrate 2 which constitutes a deposition target. As described above, when the deposition source nozzle unit 920 includes the plurality of deposition source nozzles 921 arranged in the Y-axis direction, that is, the scanning direction of the substrate 2. Since there is only one line of deposition nozzle 921 in the X-axis direction, and thus no shadow zone may be formed on the substrate 2. In addition, since the plurality of deposition source nozzles 921 are arranged in the scanning direction of the substrate 2, even there is a difference in flux between the deposition source nozzles 921, the difference may be compensated for and deposition uniformity may be maintained constant.

Also, the substrate 2 is moved relative to the organic layer deposition assembly 900 in a state of being fixed by the electrostatic chuck of the transfer unit 430, and thus, the deposition process may be performed.

In addition, although not shown in FIG. 13, the present invention may include an organic layer deposition apparatus including a plurality of the organic layer deposition assemblies 900 according to the present embodiment so that the deposition is performed while the substrate 2 may pass through each of the organic layer deposition assemblies 900 sequentially.

Figure 14:
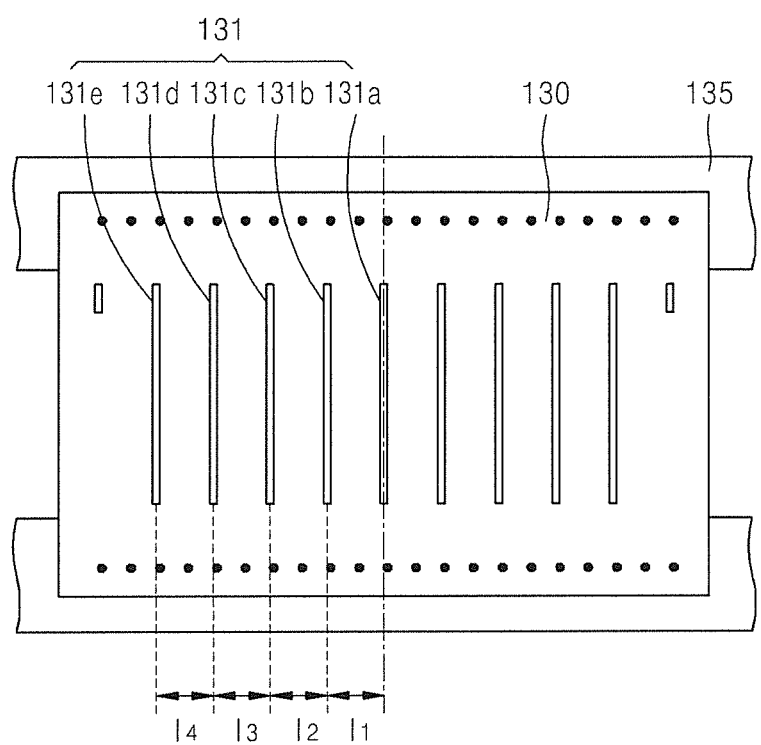
FIG. 14 is a diagram showing patterning slits formed in a patterning slit sheet of the organic layer deposition apparatus of FIG. 5 at equal intervals.
Figure 15:
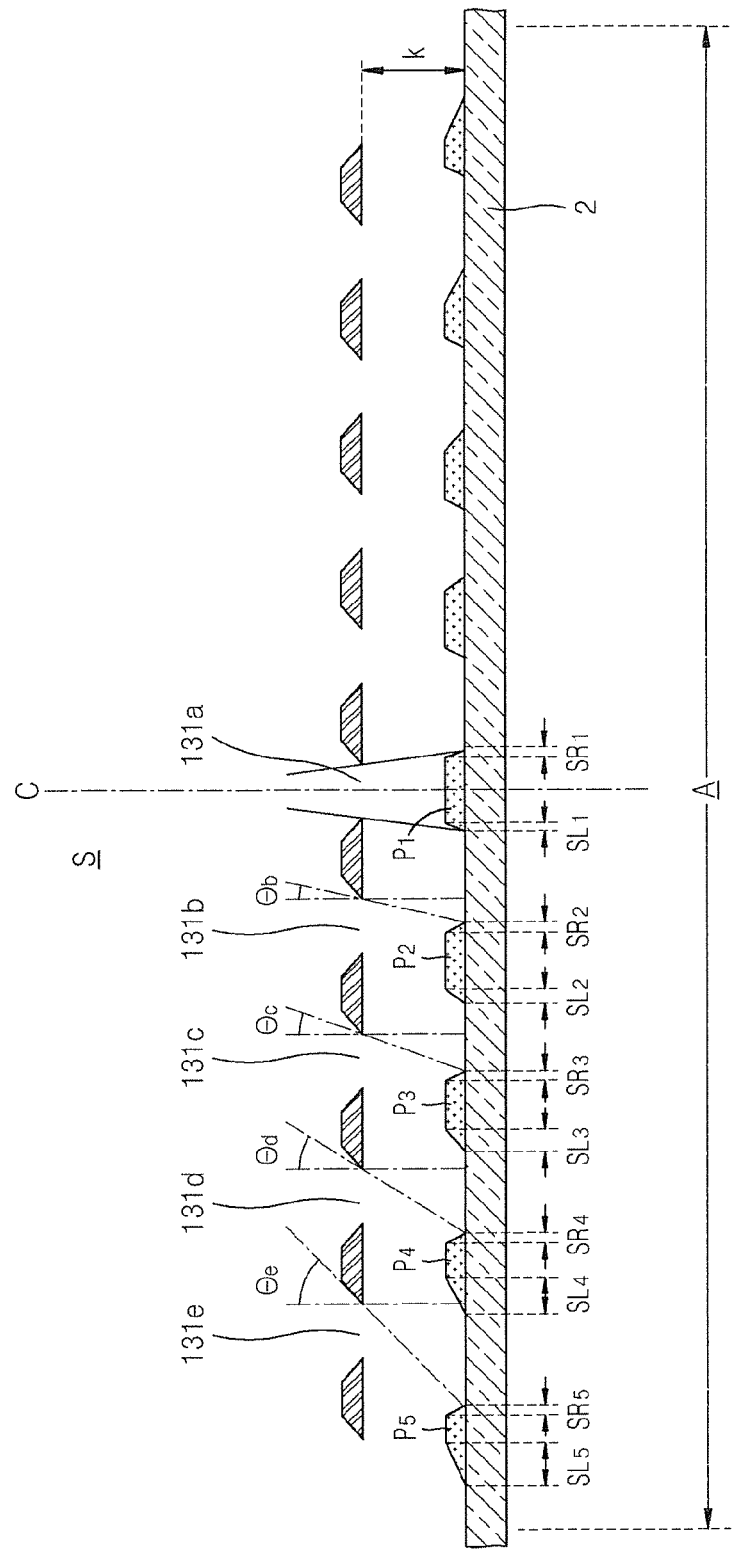
FIG. 15 is a diagram showing an organic layer formed on a substrate by using the patterning slit sheet of FIG. 14.

FIG. 14 is a diagram showing the patterning slit sheets formed at equal intervals in the patterning slit sheet of the organic layer deposition apparatus shown in FIG. 5, and FIG. 15 is a diagram showing an organic layer formed on the substrate by the patterning slit sheets shown in FIG. 14.

FIGS. 14 and 15 illustrate the patterning slit sheet 130 in which the patterning slits 131 are arranged at equal intervals. That is, in FIG. 14, the patterning slits 131 satisfy the following condition: $I_1 = I_2 = I_3 = I_4$.

The patterning slit sheet 130 is bound to the frame 135.

In this embodiment, an incident angle of a deposition material discharged along a center line C of a deposition space S is substantially perpendicular to the substrate 2. Thus, an organic layer $P_1$ formed using the deposition material that has passed through a patterning slit 131a has a minimum size of a shadow, and a right-side shadow $SR_1$ and a left-side shadow $SL_1$ are formed symmetrical to each other. Here, the deposition space S is a space on which the deposition pattern is formed on the substrate 2 by using the patterning slits 131.

However, a critical incident angle θ of the deposition material that passes through patterning slits disposed farther from the center line C of the deposition space S gradually increases, and thus, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. In particular, a left-side shadow $SR_5$ is larger than a right-side shadow $SR_5$.

That is, as the critical incident angle θ of the deposition material increases, the size of the shadow also increases. In particular, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits disposed farther from the center line C of the deposition space S have a larger shadow size. In particular, of the shadows on both sides of the respective organic layers, the size of the shadow at a position farther from the center line C of the deposition space S is larger than that of the other.

That is, referring to FIG. 15, the organic layers formed on the left side of the center line C of the deposition space S have a structure in which a left hypotenuse (left slanted side) is larger than a right hypotenuse (right slanted side), and the organic layers formed on the right side of the center line C of the deposition space S have a structure in which a right hypotenuse (right slanted side) is larger than a left hypotenuse (left slanted side).

In addition, in the organic layers formed on the left side of the center line C of the deposition space S, the length of the left hypotenuse (left slanted side) increases towards the left. In the organic layers formed on the right side of the center line C of the deposition space S, the length of the right hypotenuse (right slanted side) increases towards the right. Consequently, the organic layers formed in the deposition space S may be formed symmetrical to each other about the center line C of the deposition space S.

In this regard, the critical incident angles satisfy the following condition: $\theta_b < \theta_c < \theta_d < \theta_e$, and thus, the sizes of the shadows of the organic layers also satisfy the following condition: $SL_1 < SL_2 < SL_3 < SL_4 < SL_5$.

The above described shadow emission layer SEML is mainly generated due to the shadow occurring during the deposition process. That is, for example, before forming the organic emission layer EML(R) emitting the red visible light in the red intermediate layer 32R, shadows of the organic emission layers of the blue intermediate layer 32B or the green intermediate layer 32G remain in the red intermediate layer 32R, and thus, the shadow emission layer SEML is formed, and the organic emission layer EML(R) is formed on the shadow emission layer SEML.

Such the shadow emission layer SEML interferes with the light emission of the organic emission layer EML(R). That is, a large extent of the light emission region in the organic emission layer EML(R) occurs on the interface between the organic emission layer EML(R) and the HTL, and in the present embodiment, since the HTL and the shadow emission layer SEML contact each other, abnormal emission occurs from the shadow emission layer SEML.

However, the organic emission layer EML(R) of the present embodiment is configured to contain the hole transport material, for example, the host material contains the hole transport material, so that the light emission region is possibly moved toward the organic emission layer EML(R) from the shadow emission layer SEML. As such, the light emission characteristics of the red visible light emitted from the intermediate layer 32R of the red sub-pixel can be improved. That is, the light emitting efficiency from the intermediate layer 32R of the red sub-pixel is improved, and a driving voltage is reduced.

Figure 16:
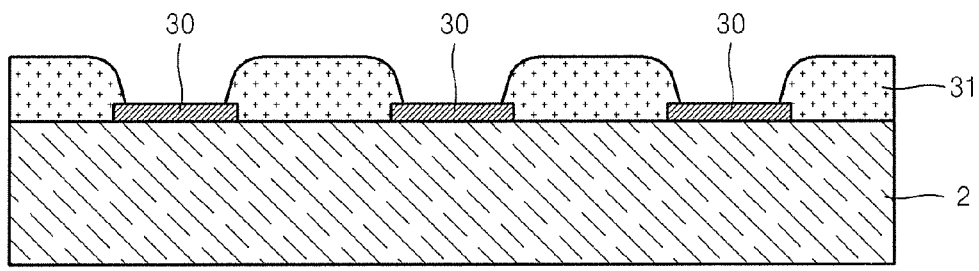
FIGS. 16 through 18 are diagrams sequentially illustrating a method of manufacturing the organic light emitting display apparatus of FIG. 1.
Figure 17:
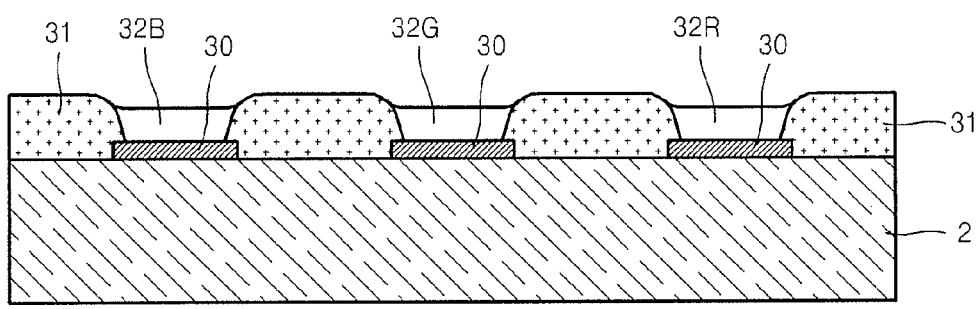
Figure 18:
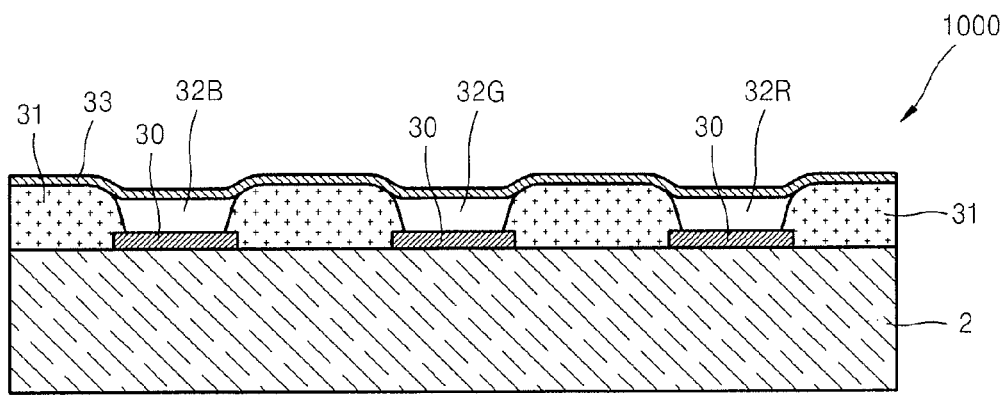

FIGS. 16 through 18 are diagrams sequentially illustrating a method of manufacturing the organic light emitting display apparatus 1000 of FIG. 1. The manufacturing method may be applied to the organic light emitting display apparatuses shown in FIGS. 1 and 2.

Referring to FIG. 16, the first electrode 30 and the pixel defining layer 31 are formed on the substrate 2.

Referring to FIG. 17, the intermediate layers 32R, 32G, and 32B of the sub-pixels are formed.

The intermediate layers 32R, 32G, and 32B may be moved and sequentially formed by using the organic layer deposition apparatus 1 with the organic layer deposition assemblies 700, 800, and/or 900. In addition, although the shadow emission layer SEML may be formed that degrades the light emitting characteristics, the organic emission layer according to embodiments of the present invention contains the hole transport material in the embodiment so as to improve the light emitting characteristics.

Then, referring to FIG. 18, the second electrode 33 is formed on the intermediate layers 32R, 32G, and 32B, and then, the organic light emitting display apparatus 100 is completely formed.

According to the organic light emitting display apparatus and the method of manufacturing the organic light emitting display apparatus, the light emitting characteristics may be easily improved.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light emitting display apparatus comprising a plurality of sub-pixels on a substrate, wherein each of the sub-pixels comprises:
   a first electrode on the substrate;
   an intermediate layer on the first electrode and comprising an organic emission layer; and
   a second electrode on the intermediate layer,
   wherein at least one sub-pixel for emitting light of a color among the sub-pixels comprises a shadow emission layer for emitting light of different color between the organic emission layer and the first electrode, and the organic emission layer of the one sub-pixel comprises a hole transport material.

2. The organic light emitting display apparatus of claim 1, wherein the sub-pixels comprise a red sub-pixel, a green sub-pixel, and a blue sub-pixel.

3. The organic light emitting display apparatus of claim 2, wherein the one sub-pixel for emitting the light of the color is the red sub-pixel, and the shadow emission layer contains a material included in at least one of the organic emission layer of the green sub-pixel and the organic emission layer of the blue sub-pixel.

4. The organic light emitting display apparatus of claim 1, wherein the shadow emission layer comprises a plurality of layers for emitting light of different colors from each other.

5. The organic light emitting display apparatus of claim 1, further comprising a hole transport layer between the first electrode and the shadow emission layer.

6. The organic light emitting display apparatus of claim 5, wherein the hole transport layer has a multi-layered structure.

7. The organic light emitting display apparatus of claim 1, further comprising a thin film transistor (TFT) electrically connected to the first electrode and including an active layer, a gate electrode, a source electrode, and a drain electrode.

8. The organic light emitting display apparatus of claim 1, wherein the intermediate layer is formed by using an organic layer deposition apparatus, and a deposition space of the intermediate layer is formed so that a slanted side of the intermediate layer far from a center of the deposition space is longer than a slanted side of the intermediate layer close to the center of the deposition space.

9. The organic light emitting display apparatus of claim 1, wherein the intermediate layer is formed by using an organic layer deposition apparatus, and in a deposition space of the intermediate layer, the further apart from a center of the deposition space, the wider a slanted side of the intermediate layer far from the center of the deposition space is.

10. The organic light emitting display apparatus of claim 1, wherein the intermediate layer is formed by using an organic layer deposition apparatus, and in a deposition space of the intermediate layer, a region of the intermediate layer disposed at a center of the deposition space has slanted opposite sides with substantially the same length.

11. The organic light emitting display apparatus of claim 1, wherein the intermediate layer is formed by using an organic layer deposition apparatus, and a region disposed at a center of the intermediate layer is symmetrically disposed based on a center of a deposition space of the intermediate layer.

12. The organic light emitting display apparatus of claim 1, wherein the substrate has a size of 40 inches or greater.

13. The organic light emitting display apparatus of claim 1, wherein the intermediate layer is formed by using an organic layer deposition apparatus, and a deposition space of the intermediate layer has a non-uniform thickness.

14. A method of manufacturing an organic light emitting display apparatus, the method comprising forming a plurality of sub-pixels on a substrate,
wherein the forming of the sub-pixels comprises:
forming a first electrode on the substrate;
forming an intermediate layer including an organic emission layer on the first electrode; and
forming a second electrode on the intermediate layer,
wherein at least one sub-pixel for emitting light of a color among the sub-pixels comprises a shadow emission layer for emitting light of different color between the organic emission layer and the first electrode, and the organic emission layer of the one sub-pixel comprises a hole transport material.

15. The method of claim 14, wherein the shadow emission layer is formed during the forming of the organic emission layers of the one sub-pixel for emitting the light of the color and another sub-pixel for emitting the light of the different color and before the forming of the organic emission layer of the one sub-pixel for emitting the light of the color among the sub-pixels.

16. The method of claim 14, wherein the intermediate layer is formed by using an organic layer deposition apparatus comprising a plurality of organic layer deposition assemblies, and each of the organic layer deposition assemblies comprises a deposition source for discharging a deposition material, a deposition source nozzle unit disposed at a side of the deposition source and comprising a plurality of deposition source nozzles, and a patterning slit sheet disposed to face the deposition source nozzle unit and comprising a plurality of patterning slits,
wherein the deposition material discharged from the deposition source passes through the patterning slit sheet and is deposited on the substrate to perform a deposition process.

17. The method of claim 16, wherein the sub-pixels comprise a red sub-pixel, a green sub-pixel, and a blue sub-pixel, and an organic emission layer of the red sub-pixel, an organic emission layer of the green sub-pixel, and an organic emission layer of the blue sub-pixel are formed respectively by using different organic layer deposition assemblies among the plurality of organic layer deposition assemblies.

18. The method of claim 16, wherein the organic layer deposition assembly for forming the organic emission layer of the one sub-pixel, and the organic layer deposition assembly for forming the shadow emission layer are disposed adjacent to each other.

19. The method of claim 16, wherein the forming of the intermediate layer by using the organic layer deposition apparatus comprises:
fixing the substrate on a transfer unit in a loading unit;
conveying the transfer unit, on which the substrate is disposed, into a chamber via a first conveyer unit that is configured to pass through the chamber;
forming the intermediate layer by moving the substrate relative to the organic layer deposition assembly so that a deposition material discharged from the organic layer deposition assembly is deposited on the substrate, in a state where the organic layer deposition assembly is disposed in the chamber and the organic layer deposition assembly in the chamber and the substrate are spaced a set distance apart from each other;
separating the substrate, on which the deposition is finished, from the transfer unit in an unloading unit; and
conveying the transfer unit separated from the substrate to the loading unit by utilizing a second conveyer unit that is configured to pass through the chamber.

20. The method of claim 19, wherein the deposition is successively performed on the substrate while the substrate passes sequentially through the plurality of organic layer deposition assemblies.

21. The method of claim 19, wherein the transfer unit circulates between the first conveyer unit and the second conveyer unit.

22. The method of claim 19, wherein the first conveyer unit and the second conveyer unit are arranged above and below.

23. The method of claim 19, wherein the transfer unit is conveyed in non-contact to the first conveyer unit in the chamber.

24. The method of claim 19, wherein the patterning slit sheet of the organic layer deposition assembly is formed smaller than the substrate in at least one of a first direction and a second direction perpendicular to the first direction.

* * * * *